United States Patent
Tai et al.

(10) Patent No.: US 8,938,658 B2
(45) Date of Patent: Jan. 20, 2015

(54) STATISTICAL READ COMPARISON SIGNAL GENERATION FOR MEMORY SYSTEMS

(75) Inventors: Ying Yu Tai, Mountain View, CA (US); Yueh Yale Ma, Palo Alto, CA (US)

(73) Assignee: Sandisk Enterprise IP LLC, Milpitas, CA (US)

( * ) Notice: Subject to any disclaimer, the term of this patent is extended or adjusted under 35 U.S.C. 154(b) by 121 days.

(21) Appl. No.: 13/602,031

(22) Filed: Aug. 31, 2012

(65) Prior Publication Data

US 2013/0117613 A1 May 9, 2013

Related U.S. Application Data

(60) Provisional application No. 61/556,793, filed on Nov. 7, 2011.

(51) Int. Cl.
| | |
|---|---|
| G11C 29/00 | (2006.01) |
| G11C 11/56 | (2006.01) |
| G11C 16/26 | (2006.01) |
| G06F 11/10 | (2006.01) |

(52) U.S. Cl.
CPC ........ *G06F 11/1048* (2013.01); *G11C 11/5642* (2013.01); *G11C 16/26* (2013.01)
USPC .......................................... 714/769; 714/774

(58) Field of Classification Search
USPC ........... 386/248; 365/248; 714/773, 769, 718, 714/48, 774
See application file for complete search history.

(56) References Cited

U.S. PATENT DOCUMENTS

| | | |
|---|---|---|
| 4,916,652 A | 4/1990 | Schwarz et al. |
| 5,270,979 A | 12/1993 | Harari et al. |
| 5,519,847 A | 5/1996 | Fandrich et al. |

(Continued)

FOREIGN PATENT DOCUMENTS

| | | |
|---|---|---|
| EP | 1465203 A1 | 10/2004 |
| EP | 1 990 921 A2 | 11/2008 |

(Continued)

OTHER PUBLICATIONS

Sandisk Enterprise, ISR/WO, PCT/US2012/059459, Feb. 14, 2013, 9 pgs.

(Continued)

*Primary Examiner* — David Ton
(74) *Attorney, Agent, or Firm* — Morgan, Lewis & Bockius LLP

(57) ABSTRACT

Implementations include systems, methods and/or devices suitable for use in a memory system that may enhance the performance of error control codes used to improve the reliability with which data can be stored and read. Some implementations include systems, methods and/or devices enabled to generate and utilize soft information for decoding encoded data read from a storage medium. More specifically, some implementations utilize a collection of characterization vectors that include soft information values for bit-tuples that may be read from the storage medium for various combinations of the storage medium characterization parameter values. Some implementations are enabled to determine and utilize read comparison signal values associated with one or more storage medium characterization parameter values. And some implementations are enabled to determine and utilize shifted read comparison signal values associated with one or more storage medium characterization parameter values and an identified error condition.

26 Claims, 12 Drawing Sheets

(56) References Cited

U.S. PATENT DOCUMENTS

| | | | |
|---|---|---|---|
| 5,530,705 A | 6/1996 | Malone, Sr. | |
| 5,537,555 A | 7/1996 | Landry et al. | |
| 5,551,003 A | 8/1996 | Mattson et al. | |
| 5,657,332 A | 8/1997 | Auclair et al. | |
| 5,666,114 A | 9/1997 | Brodie et al. | |
| 5,708,849 A | 1/1998 | Coke et al. | |
| 5,943,692 A | 8/1999 | Marberg et al. | |
| 5,982,664 A | 11/1999 | Watanabe | |
| 6,000,006 A | 12/1999 | Bruce et al. | |
| 6,016,560 A | 1/2000 | Wada et al. | |
| 6,018,304 A | 1/2000 | Bessios | |
| 6,070,074 A | 5/2000 | Perahia et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh | |
| 6,311,263 B1 | 10/2001 | Barlow et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,895,464 B2 | 5/2005 | Chow et al. | |
| 6,978,343 B1 | 12/2005 | Ichiriu | |
| 6,980,985 B1 * | 12/2005 | Amer-Yahia et al. | 1/1 |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,032,123 B2 | 4/2006 | Kane et al. | |
| 7,043,505 B1 | 5/2006 | Teague et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,328,377 B1 * | 2/2008 | Lewis et al. | 714/48 |
| 7,516,292 B2 | 4/2009 | Kimura et al. | |
| 7,523,157 B2 | 4/2009 | Aguilar, Jr. et al. | |
| 7,527,466 B2 * | 5/2009 | Simmons | 414/10 |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,596,643 B2 | 9/2009 | Merry, Jr. et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich et al. | |
| 7,996,642 B1 | 8/2011 | Smith | |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,254,181 B2 | 8/2012 | Hwang et al. | |
| 8,312,349 B2 | 11/2012 | Reche et al. | |
| 8,412,985 B1 | 4/2013 | Bowers et al. | |
| 2002/0024846 A1 | 2/2002 | Kawahara et al. | |
| 2002/0083299 A1 | 6/2002 | Van Huben et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid et al. | |
| 2003/0088805 A1 | 5/2003 | Majni et al. | |
| 2003/0093628 A1 | 5/2003 | Matter et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0237018 A1 | 11/2004 | Riley | |
| 2005/0060456 A1 | 3/2005 | Shrader et al. | |
| 2005/0060501 A1 | 3/2005 | Shrader | |
| 2005/0114587 A1 | 5/2005 | Chou et al. | |
| 2005/0172065 A1 | 8/2005 | Keays | |
| 2005/0172207 A1 | 8/2005 | Radke et al. | |
| 2005/0193161 A1 | 9/2005 | Lee et al. | |
| 2005/0201148 A1 | 9/2005 | Chen et al. | |
| 2005/0231765 A1 | 10/2005 | So et al. | |
| 2005/0257120 A1 | 11/2005 | Gorobets et al. | |
| 2005/0273560 A1 | 12/2005 | Hulbert et al. | |
| 2005/0289314 A1 | 12/2005 | Adusumilli et al. | |
| 2006/0039196 A1 | 2/2006 | Gorobets et al. | |
| 2006/0053246 A1 | 3/2006 | Lee | |
| 2006/0085671 A1 | 4/2006 | Majni et al. | |
| 2006/0136570 A1 | 6/2006 | Pandya | |
| 2006/0156177 A1 | 7/2006 | Kottapalli et al. | |
| 2006/0195650 A1 | 8/2006 | Su et al. | |
| 2006/0259528 A1 | 11/2006 | Dussud et al. | |
| 2007/0011413 A1 | 1/2007 | Nonaka et al. | |
| 2007/0058446 A1 | 3/2007 | Hwang et al. | |
| 2007/0061597 A1 | 3/2007 | Holtzman et al. | |
| 2007/0076479 A1 | 4/2007 | Kim et al. | |
| 2007/0081408 A1 | 4/2007 | Kwon et al. | |
| 2007/0083697 A1 | 4/2007 | Birrell et al. | |
| 2007/0091677 A1 | 4/2007 | Lasser et al. | |
| 2007/0113019 A1 | 5/2007 | Beukema et al. | |
| 2007/0133312 A1 | 6/2007 | Roohparvar | |
| 2007/0147113 A1 | 6/2007 | Mokhlesi et al. | |
| 2007/0150790 A1 | 6/2007 | Gross et al. | |
| 2007/0157064 A1 | 7/2007 | Falik et al. | |
| 2007/0174579 A1 | 7/2007 | Shin | |
| 2007/0180188 A1 | 8/2007 | Fujibayashi et al. | |
| 2007/0201274 A1 | 8/2007 | Yu et al. | |
| 2007/0208901 A1 | 9/2007 | Purcell et al. | |
| 2007/0234143 A1 | 10/2007 | Kim | |
| 2007/0245061 A1 | 10/2007 | Harriman | |
| 2007/0277036 A1 | 11/2007 | Chamberlain et al. | |
| 2007/0291556 A1 | 12/2007 | Kamei | |
| 2007/0294496 A1 | 12/2007 | Goss et al. | |
| 2007/0300130 A1 | 12/2007 | Gorobets | |
| 2008/0019182 A1 | 1/2008 | Yanagidaira et al. | |
| 2008/0022163 A1 | 1/2008 | Tanaka et al. | |
| 2008/0052446 A1 | 2/2008 | Lasser et al. | |
| 2008/0056005 A1 | 3/2008 | Aritome | |
| 2008/0077841 A1 | 3/2008 | Gonzalez et al. | |
| 2008/0077937 A1 | 3/2008 | Shin et al. | |
| 2008/0086677 A1 | 4/2008 | Yang et al. | |
| 2008/0144371 A1 | 6/2008 | Yeh et al. | |
| 2008/0147964 A1 | 6/2008 | Chow et al. | |
| 2008/0147998 A1 | 6/2008 | Jeong | |
| 2008/0148124 A1 | 6/2008 | Zhang et al. | |
| 2008/0163030 A1 | 7/2008 | Lee | |
| 2008/0168191 A1 | 7/2008 | Biran et al. | |
| 2008/0168319 A1 | 7/2008 | Lee et al. | |
| 2008/0170460 A1 | 7/2008 | Oh et al. | |
| 2008/0229000 A1 | 9/2008 | Kim | |
| 2008/0229003 A1 | 9/2008 | Mizushima et al. | |
| 2008/0229176 A1 | 9/2008 | Arnez et al. | |
| 2008/0270680 A1 | 10/2008 | Chang | |
| 2008/0282128 A1 | 11/2008 | Lee et al. | |
| 2008/0285351 A1 * | 11/2008 | Shlick et al. | 365/185.18 |

(56) References Cited

U.S. PATENT DOCUMENTS

| | | |
|---|---|---|
| 2009/0003058 A1 | 1/2009 | Kang |
| 2009/0037652 A1 | 2/2009 | Yu et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0319864 A1 | 12/2009 | Shrader |
| 2010/0061151 A1 | 3/2010 | Miwa et al. |
| 2010/0103737 A1 | 4/2010 | Park |
| 2010/0161936 A1 | 6/2010 | Royer et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0096217 A1 | 4/2012 | Son et al. |
| 2012/0110250 A1 | 5/2012 | Sabbag et al. |
| 2012/0151253 A1 | 6/2012 | Horn |
| 2012/0151294 A1 | 6/2012 | Yoo et al. |
| 2012/0195126 A1 | 8/2012 | Roohparvar |
| 2012/0239976 A1 | 9/2012 | Cometti et al. |
| 2012/0284587 A1 | 11/2012 | Yu et al. |
| 2014/0136927 A1 | 5/2014 | Li et al. |

FOREIGN PATENT DOCUMENTS

| | | |
|---|---|---|
| JP | 2002-532806 S | 10/2002 |
| WO | WO 2007/036834 A2 | 4/2007 |
| WO | WO 2007/080586 A2 | 7/2007 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |

OTHER PUBLICATIONS

SanDisk Enterprise, Office Action, CN 200880127623.8, Dec. 31, 2012, 9 pgs.
Sandisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
Canim, Buffered Bloom ilters on Solid State Storage, ADMS*10, Singapore, Sep. 13-17, 2010, 8 pgs.
Lu, A Forest-structured Bloom Filter with Flash Memory, MSST 2011, Denver, CO, MAY 23-27, 2011, article, 6 pgs.
Lu, A Forest-structured Bloom Filter with Flash Memory, MSST 2011, Denver, CO, May 23-27, 2011, presentation slides, 25 pgs.
SanDisk Enterprise IP LLC, Notification of the Decision to Grant a Patent Right for Patent for Invention, CN 200880127623.8, Jul. 4, 2013, 1 pg.
Barr, Introduction to Watchdog Timers, Oct. 2001, 3 pgs.
Kim, A Space-Efficient Flash Translation Layer for CompactFlash Systems, May 2002, 10 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, ISR/WO, PCT/US08/88133, Mar. 19, 2009, 7 pgs.
Pliant Technology, ISR/WO, PCT/US08/88136, Mar. 19, 2009, 7 pgs.
Pliant Technology, ISR/WO, PCT/US08/88146, Feb. 26, 2009, 10 pgs.
Pliant Technology, ISR/WO, PCT/US08/88154, Feb. 27, 2009, 9 pgs.
Pliant Technology, WO, PCT/US08/88164, Feb. 13, 2009, 6 pgs.
Pliant Technology, ISR/WO, PCT/US08/88206, Feb. 18, 2009, 8 pgs.
Pliant Technology, ISR/WO, PCT/US08/88217, Feb. 19, 2009, 7 pgs.
Pliant Technology, ISR/WO, PCT/US08/88229, Feb. 13, 2009, 8 pgs.
Pliant Technology, ISR/WO, PCT/US08/88232, Feb. 19, 2009, 8 pgs.
Pliant Technology, ISR/WO, PCT/US08/88236, Feb. 19, 2009, 7 pgs.
Pliant Technology, ISR/WO, PCT/US2011/028637, Oct. 27, 2011, 11 pgs.
Pliant Technology, Supplementary ESR, 08866997.3, Feb. 23, 2012, 6 pgs.
SanDisk Enterprise, ISR/WO, PCT/US2012/042764, Aug. 31, 2012, 12 pgs.
SanDisk Enterprise, ISR/WO, PCT/US2012/042775, Sep. 26, 2012, 9 pgs.
SanDisk Enterprise, Office Action, CN 200880127623.8, Apr. 18, 2012, 12 pgs.
SanDisk Enterprise, Office Action, JP 2010-540863, Jul. 24, 2012, 3 pgs.
Zeidman, 1999 Verilog Designer's Library (04US), 9 pgs.
Kang, A Multi-Channel Architecture for High-Performance NAND Flash-Based Storage System, J. Syst. Archit., 53, 9, Sep. 2007, 15 pgs.
Watchdog Timer and Power Savin Modes, Microchip Technology Inc., 2005 14 pgs.
International Search Report and Written Opinion dated Jul. 25, 2014, recieved in International Patent Application No. PCT/US2014/029453, which corresponds to U.S Appl. No. 13/963,444, 9 pages (Frayer).
International Search Report and Written Opinion dated Mar. 7, 2014, received in International Patent Application No. PCT/US2013/074772, which correspond to U.S. Appl. No. 13/831,218, 10 pages (George).
International Search Report and Written Opinion dated Mar. 24, 2014, received in International Patent Application No. PCT/US2013/074777, which corresponds U.S. Appl. No. 13/831,374, 10 pages (George).
International Search Report and Written Opinion dated Mar. 7, 2014, received in International Patent Application No. PCT/US2013/074779, which corresponds to U.S. Appl. No. 13/831,374, 8 pages (George).

* cited by examiner

50

| $y_b$ \ $x_b$ | 0 | 1 |
|---|---|---|
| 0 | $p_{00}$ | $p_{10}$ |
| 1 | $p_{01}$ | $p_{11}$ |

Figure 5A

Characterization Vector 500

- Storage Medium Characterization Parameters 510
  - Parameter No. 1 (e.g. temperature) — 511
  - ⋮
  - Parameter No. n (e.g. P/E cycles) — 512
- Read Comparison Voltages 520
  - First Set of Read Comparison Voltages 521
    - $V_{R1-1}$ — 521a
    - $V_{R2-1}$ — 521b
    - $V_{R3-1}$ — 521c
  - Second Set of Read Comparison Voltages 522
    - $V_{R1-2}$ — 522a
    - $V_{R2-2}$ — 522b
    - $V_{R3-2}$ — 522c
- Single-Page Read - Soft Information Values 530 — 532, 533

| 531 — Read Data | LLR (lower page) | LLR (upper page) |
|---|---|---|
| 0 | LLR($y_b$ = 0) | LLR($y_b$ = 0) |
| 1 | LLR($y_b$ = 1) | LLR($y_b$ = 1) |

- Weighting Factors 540 — 542

| 541 — | Lower Page | Upper Page |
|---|---|---|
| | $\alpha_1^{(lower)}$ | $\alpha_1^{(upper)}$ |
| | $\alpha_2^{(lower)}$ | $\alpha_2^{(upper)}$ |

Figure 5B

| 60 ⟶ y \ x | 11 or '3' | 01 or '1' | 00 or '0' | 10 or '2' |
|---|---|---|---|---|
| 11 or '3' | $p_{33}$ | $p_{13}$ | $p_{03}$ | $p_{23}$ |
| 01 or '1' | $p_{31}$ | $p_{11}$ | $p_{01}$ | $p_{21}$ |
| 00 or '0' | $p_{30}$ | $p_{10}$ | $p_{00}$ | $p_{20}$ |
| 10 or '2' | $p_{32}$ | $p_{12}$ | $p_{02}$ | $p_{22}$ |

Figure 6A

Characterization Vector 600

- Storage Medium Characterization Parameters 510
  - Parameter No. 1 (e.g. temperature) — 511
  - ⋮
  - Parameter No. $n$ (e.g. P/E cycles) — 512
- Read Comparison Voltages 520
  - First Set of Read Comparison Voltages 521
    - $V_{R1\text{-}1}$ — 521a
    - $V_{R2\text{-}1}$ — 521b
    - $V_{R3\text{-}1}$ — 521c
  - Second Set of Read Comparison Voltages 522
    - $V_{R1\text{-}2}$ — 522a
    - $V_{R2\text{-}2}$ — 522b
    - $V_{R3\text{-}2}$ — 522c
- Joint-Page Read - Soft Information Values 630 — 632

| Read Data 631 | LLR (lower page) | LLR (upper page) — 633 |
|---|---|---|
| 11 | $LLR(y_0^{11})$ | $LLR(y_1^{11})$ |
| 01 | $LLR(y_0^{01})$ | $LLR(y_1^{01})$ |
| 00 | $LLR(y_0^{00})$ | $LLR(y_1^{00})$ |
| 10 | $LLR(y_0^{10})$ | $LLR(y_1^{10})$ |

- Weighting Factors 640
  - $\alpha_1$ — 641a
  - $\alpha_2$ — 641b

Figure 6B

STATISTICAL READ COMPARISON SIGNAL GENERATION FOR MEMORY SYSTEMS

RELATED APPLICATIONS

This application claims the benefit of U.S. Provisional Patent Application No. 61/556,793, filed on Nov. 7, 2011, and which is incorporated by reference herein.

TECHNICAL FIELD

The present disclosure relates to using error control in memory systems, and in particular, to generating and using soft information for decoding data read from a memory.

BACKGROUND

The ever-present demand for the continual enrichment of consumer electronics and enterprise computing systems is often accompanied by demand to improve data storage capacity. The demand for greater storage capacity in turn stokes demand for greater storage density, so that specifications such as power consumption and form factor may be maintained and preferably reduced. Non-volatile memories, and flash memory in particular, are becoming increasing popular because they have enabled increased portability of consumer electronics, and more recently, have been utilized in relatively low power enterprise mass storage systems suitable for cloud computing and other mass storage applications. As such, there is additional pressure to increase the storage density of non-volatile memories, such as flash memory, in order to further take advantage of the beneficial attributes of such devices.

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including reducing the minimum feature size of semiconductor manufacturing processes in order to increase the number of transistors—and thus memory cells—that can be included in a particular area. Additionally, in order to further increase storage density, flash memory has developed from single-level flash memory to multi-level flash memory so that two or more bits can be stored by each memory cell.

A drawback of increasing storage density is that the stored data is increasingly prone to being stored and/or read erroneously. Error control coding ("ECC") has been utilized to limit the number of uncorrectable errors that are introduced by pseudo-random fluctuations, defects in the storage medium, operating conditions, device history, and/or write-read circuitry, etc. Error control methods using soft information are particularly promising because soft information decoding may improve the error detection and correction capability of a particular error control code, and thus the capacity of the system. However, the utilization of soft information decoding has been limited because of a number of previously irresolvable drawbacks. For example, soft information decoding implementations tend to introduce undesirable delays, are generally power intensive and have relatively large semiconductor footprints. Consequently, the soft information decoding methods have remained relatively undesirable due to these and other physical constraints.

SUMMARY

Various implementations of systems, methods and devices within the scope of the appended claims each have several aspects, no single one of which is solely responsible for the attributes described herein. Without limiting the scope of the appended claims, some prominent features are described. After considering this disclosure, and particularly after considering the section entitled "Detailed Description" one will understand how the features of various implementations are used to enable: (i) generating and utilizing soft information for decoding error control encoded data read from a storage medium; (ii) determining and utilizing statistically determined read comparison signal values associated with one or more storage medium characteristics; and, (iii) determining and utilizing statistically determined shifted read comparison signal values associated with one or more storage medium characteristics.

Some implementations include systems, methods and/or devices enabled to utilize soft information error correction decoding to support the use of flash memory or other storage mediums. More specifically, in some implementations, a soft information generation system, method and/or device utilizes a pre-generated collection of characterization vectors, for corresponding sets of storage medium characterization parameter values, that includes soft information values for bit-tuples that may be read from the storage medium. In some implementations, the soft information is generated by a device characterization process for memory devices produced by a particular manufacturing process, and stored in a characterization module or look-up table. The characterization module or look-up table is indexed using storage medium characterization parameter values. During a read operation, soft information is generated by retrieving a particular characterization vector from the characterization module based on one or more storage medium characterization parameter values associated with the current state of the storage medium, and selecting a respective soft information value from the selected characterization vector for each bit-tuple in the raw data read from the storage medium.

Some implementations include systems, methods and/or devices enabled to generate soft information, in the form of log-likelihood ratios (LLR) and/or transition probabilities, from characterization vectors including soft information values for bit-tuples associated with at least one of singe-page reads and joint-page reads for multi-level flash memory devices. The soft information values may then be passed to an ECC decoder, such as a low density-parity check (LDPC) code decoder or any of a number of other error correction code decoders. Some implementations utilize statistical data from a device characterization process to generate the collection of characterization vectors for a number of combinations of device conditions and process variations indexed by one or more storage medium characterization parameter values. In some implementations, the characterization vectors each include soft information values (e.g., LLR values and/or transition probabilities). In some implementations the characterization vectors each include at least one set of read comparison signal values (e.g., voltages) determined from the statistical data of the device characterization process. In some implementations, the characterization vectors each include two sets of read comparison signal values, determined from the statistical data of the device characterization process. The second set of read comparison signal values is shifted from the first set of read comparison signal values as a function of transition probabilities derived from the device characterization process.

Some implementations enable the combination of two previously generated sequences of soft information values to produce a third sequence of soft information values, in order to limit the number of read operations used to provide error corrected data from a particular set of data locations in the storage medium. To that end, in some implementations, at least one of the characterization vectors (or, alternatively, each of the characterization vectors) include a set of weighting factors that can be used to generate the third sequence of soft information values from two previously generated sequences of soft information values. Some implementations dynamically calculate the weighting factors based on one or more current storage medium characteristics. Additionally and/or alternatively, in some implementations, the third sequence of soft information values is generated in response to an identified error condition.

In some implementations, the total latency associated with reading data can be controlled by limiting the number of read operations (e.g., at most two read operations). Moreover, in some implementations, the soft information values that are generated may be more reliable than the soft information values used in previous methods because one or more of the read comparison signal values and the soft information values for particular bit-tuples are based on one or more storage medium characterization parameters values, such as an indication of at least one of a physical characteristic associated with at least a portion the storage medium, a mode of operation associated with at least a portion of the storage medium, a history of use associated with at least a portion of the storage medium, a condition characteristic associated with at least a portion of the storage medium, a read type associated with at least a portion of the storage medium, and a location associated with at least a portion of the storage medium.

Some implementations include systems, methods and/or devices enabled to read data from a storage medium using a statistically determined read comparison signal value, selected based on a set of one or more storage medium characterization parameter values associated with the current state of the storage medium. In some implementations, the statistically determined read comparison signal values are stored in a collection of characterization vectors, and are generated by a characterization process for devices produced by a particular manufacturing process.

Some implementations include systems, methods and/or devices enabled to read data from a storage medium using a statistically determined shifted read comparison signal value, which is offset relative to a nominal read comparison signal value or a statistically determined first read comparison signal value based on transition probabilities, and used in response to an identified error condition. In some implementations, the statistically determined shifted read comparison signal value is selected based on a set of one or more storage medium characterization parameter values associated with the current state of the storage medium. In some implementations, the various shifted read comparison signal values are stored in a collection of characterization vectors, and are generated by a characterization process for devices produced by a particular manufacturing process.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 5A is a transition probability table that may be associated with either a single-level memory cell or a single-page read of a multi-level memory cell.

FIG. 5B is a schematic diagram of an implementation of a characterization vector that may be produced from the transition probability table of FIG. 5A.

FIG. 6A is a transition probability table that may be associated with a joint-page read of a multi-level memory cell.

FIG. 6B is a schematic diagram of an implementation of a characterization vector that may be produced from the transition probability table of FIG. 6A.

Figure 1:
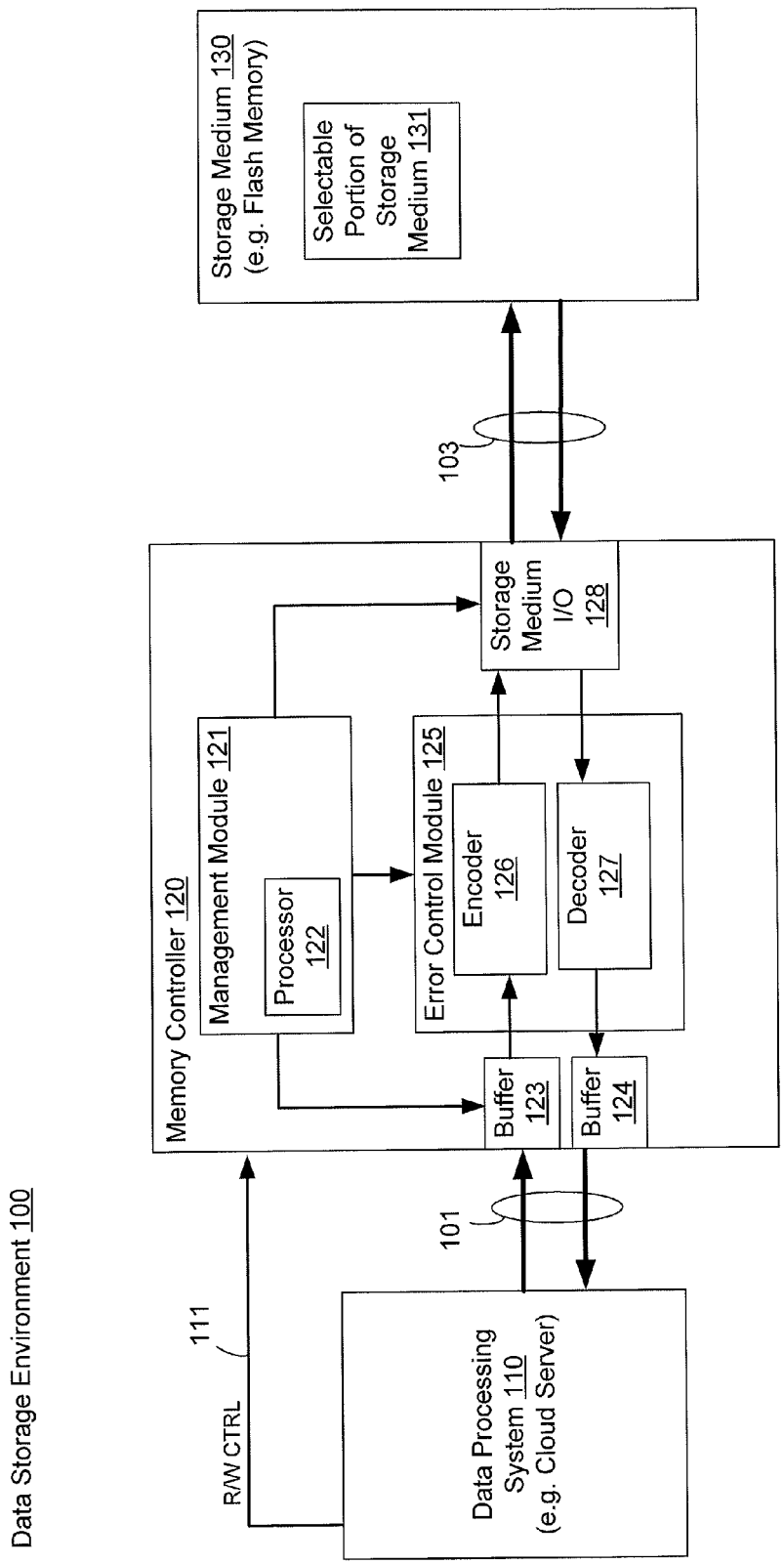
FIG. 1 is a diagram of an implementation of a data storage environment.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices that may enhance the performance of error control codes used to improve the reliability with which data can be stored and read in a memory. Some implementations include systems, methods and/or devices to generate and utilize soft information for decoding error control encoded data read from a storage medium. More specifically, some implementations utilize a collection of characterization vectors that include soft information values for bit-tuples that may be read from the storage medium, each characterization vector corresponding to a different set of storage medium characterization parameter values. Additionally and/or alternatively, some implementations are enabled to determine and utilize read comparison signal values, identified from corresponding sets of statistical distributions associated with one or more storage medium characterization parameter values, in order to produce a first sequence of soft information values. Additionally and/or alternatively, some implementations are enabled to determine and utilize shifted read comparison signal values associated with one or more storage medium characterization parameter values and an identified error condition, in order to produce a second sequence of soft information values. Additionally and/or alternatively, some implementations are enabled to combine the first and second sequences of soft information values to produce a third sequence of soft information values in response to an identified error condition.

Numerous details are described herein in order to provide a thorough understanding of the example implementations illustrated in the accompanying drawings. However, the invention may be practiced without many of the specific details. And, well-known methods, components, and circuits have not been described in exhaustive detail so as not to unnecessarily obscure more pertinent aspects of the implementations described herein.

FIG. 1 is a diagram of an implementation of a data storage environment 100. While some example features are illustrated, those skilled in the art will appreciate from the present disclosure that various other features have not been illustrated for the sake of brevity and so as not to obscure more pertinent aspects of the example implementations disclosed herein. To that end, as a non-limiting example, the data storage environment 100 includes a data processing system 110, a memory controller 120, and a storage medium 130. In some implementations, storage medium 130 comprises one or more flash memory devices. In some implementations, storage medium 130 comprises at least one of NAND-type flash memory and NOR-type flash memory.

The data processing system 110 is coupled to the memory controller 120 through data connections 101. Moreover, those skilled in the art will appreciate from the present disclosure that in various implementations the data processing system 110 includes the memory controller 120 as a component. The data processing system 110 may be any suitable computer device, such as a computer, a laptop computer, a tablet device, a netbook, an interne kiosk, a personal digital assistant, a mobile phone, a smart phone, a gaming device, a computer server, or any other computing device. In some implementations, the data processing system 110 includes one or more processors, one or more types of memory, a display and/or other user interface components such as a keyboard, a touch screen display, a mouse, a track-pad, a digital camera and/or any number of supplemental devices to add functionality.

The storage medium 130 is coupled to the memory controller 120 through data connections 103. Moreover, those skilled in the art will appreciate from the present disclosure that in various implementations the memory controller 120 and storage medium 130 are included in the same device as constituent components thereof. The storage media 130 may include any number (i.e., one or more) of memory devices including, without limitation, non-volatile semiconductor memory devices, such as flash memory. For example flash memory devices can be configured for enterprise storage suitable for applications such as cloud computing. Additionally and/or alternatively, flash memory can also be configured for relatively smaller-scale applications such as personal flash drives or hard-disk replacements for personal, laptop and tablet computers.

Storage mediums are often divided into a number of addressable and individually selectable blocks, such as selectable portion 131. In some embodiments, for flash memory, the individually selectable blocks are the minimum size erasable units in a flash memory device. In other words, each block contains a minimum number of memory cells that can be erased simultaneously. Each block is usually further divided into a plurality of pages, where each page is typically an instance of a minimum unit the smallest individually accessible sub-block in the block. However, a minimum unit of a data set may also be a sector in some types of flash memory. That is, each page contains a plurality of sectors and each sector is a minimum unit of the data set such that a page is the minimum unit for data writing or reading to the flash memory device.

Generally, one block may comprise any number of pages, for example, 64 pages, 128 pages, 256 pages, or another suitable number of pages. Blocks are typically grouped into a plurality of zones. Each block zone can be independently managed to some extent, which increases the degree of parallelism of parallel operations and simplifies management of storage medium 130.

As noted above, while data storage densities of non-volatile semiconductor memory devices are generally increasing, a drawback of increasing storage density is that the stored data is increasingly prone to being stored and/or read erroneously. As described in greater detail below, error control coding can be utilized to limit the number of uncorrectable errors that are introduced by pseudo-random fluctuations, defects in the storage medium, operating conditions, device history, write-read circuitry, etc., or a combination of such factors.

In some implementations, memory controller 120 includes a management module 121, an input buffer 123, an output buffer 124, an error control module 125 and a storage medium interface (I/O) 128. Those skilled in the art will appreciate from the present disclosure that memory controller 120 may include various additional features that have not been illustrated for the sake of brevity and so as not to obscure more pertinent features of the example implementations disclosed herein, and that a different arrangement of features may be possible. The input and output buffers 123,124 provide an interface to the data processing system 110 through the data connections 101. Similarly, storage medium I/O 128 provides an interface to storage medium 130 though data connections 103. In some implementations, storage medium I/O 128 includes read and write circuitry, including circuitry capable of providing read comparison signal values to storage medium 130.

In some implementations, management module 121 includes a processor 122 configured to execute instructions in one or more programs, e.g., in management module 121. However, those skilled in the art will appreciate from the present disclosure that processor 122 may be shared by one or more components within, and in some cases, beyond the function of memory controller 120. Management module 121 is coupled to the input and output buffers 123, 124, error control module 125 and storage medium I/O 128 in order to coordinate the operation of these components.

Error control module 125 is coupled between the storage medium I/O 128 and the input and output buffers 123, 124. The error control module 125 is provided to limit the number of uncorrectable errors inadvertently introduced into data. To that end, the error control module 125 includes an encoder 126 and a decoder 127. The encoder 126 encodes data by applying an error control code to produce a codeword which is subsequently stored in storage medium 130. When the encoded data is read from the storage medium, decoder 127 applies a decoding process to recover the data, and to correct errors in the recovered data within the error correcting capability of the error control code. Those skilled in the art will appreciate from the present disclosure that various error control codes have different error detection and correction capacities, and that particular codes are selected for various applications for reasons beyond the necessary scope of this disclosure. As such, an exhaustive review of the various types of error control codes has not been provided for the sake of brevity. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from the data processing system 110. The data in input buffer 123 is made available to encoder 126, which encodes the data to produce a codeword. The codeword is made available to the storage medium I/O 128, which transfers the codeword to storage medium 130 in a manner dependent on the type of storage medium being utilized. During a read operation for the same data, the storage medium I/O 128 accesses the portion of storage medium 130 in which the corresponding codeword is stored to read the codeword and provide the codeword to decoder 127.

If the decoding is successful, the decoded data is provided to the output buffer 124, where the decoded data is made available to the data processing system 110. In some implementations, if the decoding is not successful, memory controller 120 reads the codeword from the storage medium again using different decoding or error correction, as discussed in more detail below.

For many error control codes, the decoding process can be improved by using soft information. Hard information decoding generally means that absolute decisions are made as to whether a data value (e.g., data-bit or code-bit) is one symbol or another in a particular symbol alphabet. For example, in a binary system, a particular data value can be either "0" or "1", even if the raw electrical analog value read from a storage location does not indicate that the electrical value representing the data value is sufficient to decide with certainty that the data value is "0" or "1." In other words, a hard-decision for a particular data value is based on the most likely symbol corresponding to the analog electrical value read from the storage medium, and the probabilities that alternative decisions may be true are ignored by the hard-decision process. Often the hard-decision is based on the Euclidian distances from the analog read value to electrical level(s) defining the symbols. By contrast, the use of soft information does not ignore the probabilities that different outcomes are true in view of what is read from the storage medium. Error control methods using soft information are particularly promising because soft information decoding often improves the error detection and correction capability of a particular error control code, and thus the capacity of the system.

However, as discussed above, the utilization of soft information decoding has been limited because of a number of previously irresolvable drawbacks. One particularly difficult challenge has been managing the delay previously required to create soft information having sufficient statistical accuracy to make the use of soft information beneficial. Due to effects from pseudo-random electrical fluctuations, operating conditions and device history, the result of any one data read may not be statistically representative of the current set of cumulative effects on the stored data. As such, using previous methods, soft information generation required reading the same data a number of times and combining the read results to generate statistically accurate soft information value for each bit or symbol. The accuracy of the soft information generally improves with the number of reads. But each read adds a delay, and the aggregate delay to generate accurate soft information for an entire sequence of data values made the use of soft information undesirable.

By contrast, as discussed below some implementations include systems, methods and/or devices enabled to utilize soft information error correction decoding to support the use of flash memory or other storage mediums. More specifically, in some implementations, a soft information generation system, method and/or device utilizes a pre-generated collection of characterization vectors that includes soft information values for bit-tuples that may be read from the storage medium for various combinations of storage medium characterization parameter values. In some implementations, the soft information is generated by a device characterization process for memory devices produced by a particular manufacturing process, and stored in a characterization module or look-up table, which is indexed using storage medium characterization parameter values. During a read operation, a sequence of soft information is generated by retrieving a particular characterization vector from the characterization module based on one or more storage medium characterization parameter values associated with the current state of the storage medium, and selecting a respective soft information value from the selected characterization vector for each bit-tuple in the raw data read from the storage medium. The storage medium characterization parameter values associated with the current state of the storage medium are sometimes said to be associated with the current state of the storage medium, since the storage medium characterization parameter values represent only some aspects of the state of the storage medium.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, can be used to represent one or more data values. During a read operation a read voltage is applied to the control gate of the transistor and the resulting current or voltage is mapped to a data value.

In order to increase storage density in flash memory, flash memory has developed from single-level flash memory to multi-level flash memory so that two or more bits can be stored by each memory cell. A single-level flash memory cell (SLC) stores one bit of information ("0" or "1"). In other words, the storage density of a SLC memory device is one bit per cell (or transistor). A multi-level flash memory cell (MLC) can store two or more bits by using different ranges within the total voltage range of a cell to represent multi-bit bit-tuples. In turn, the storage density of a MLC memory device is multiple-bits per cell (e.g., 2 bits per transistor).

As discussed below with reference to FIG. 2, a MLC memory device is used to store multiple bits by using voltage ranges within the total voltage range of the memory cell to represent different bit-tuples. A MLC memory device is typically more error prone than a SLC memory device created using the same manufacturing process because the effective voltage difference between the voltages used to store different data values is smaller for a MLC memory device. Moreover, due to any number of a combination of factors, such as pseudo-random electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 2, the impact of such errors can be reduced by grey-coding the data, such that adjacent voltage ranges represent single-bit changes between bit-tuples.

Figure 2:
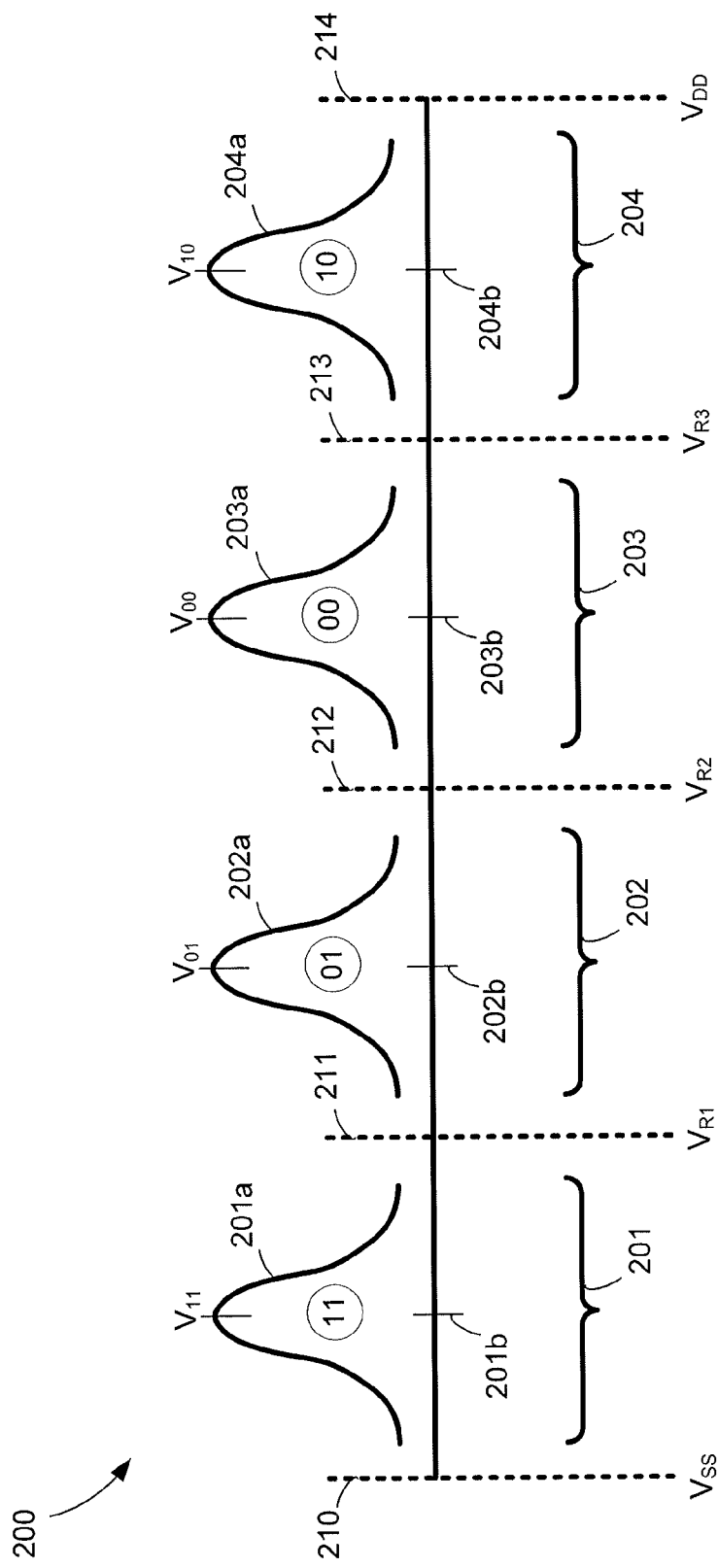
FIG. 2 is a diagram of voltage distributions that may be found in a multi-level flash memory cell over time.

FIG. 2 is a diagram of voltage distributions 200 that may be found in a multi-level flash memory cell over time. Those skilled in the art will appreciate from the present disclosure that the voltage distributions 200 have been simplified for illustrative purposes. The cell voltage of a MLC approximately extends from the voltage, $V_{SS}$ 210, at the source terminal of a NMOS transistor to the voltage, $V_{DD}$ 214, at the drain terminal.

Sequential voltage ranges 201, 202, 203, 204 between the source and drain voltages, $V_{SS}$ 210 and $V_{DD}$ 214, are used to represent corresponding bit-tuples "11", "01", "00", "10", respectively. Each voltage range 201, 202, 203, 204 has a respective center voltage 201b, 202b, 203b, 204b. Each voltage range 201, 202, 203, 204 also has a respective distribution of voltages 201a, 202a, 203a, 204a that may occur as a result of any number of a combination of factors, such as pseudo-random electrical fluctuations, defects in the storage medium, operating conditions, device history (e.g., large numbers of program-erase (P/E) cycles), and/or imperfect performance or design of write-read circuitry.

Ideally, during a write operation, the charge on the floating gate of the MLC would be set such that the resultant cell voltage is at the center of one of the ranges 201, 202, 203, 204 in order to write the corresponding bit-tuple to the MLC. Specifically, the resultant cell voltage would be set to one of $V_{11}$ 201b, $V_{10}$ 202b, $V_{00}$ 203b and $V_{10}$ 204b in order to write a corresponding one of the bit-tuples "11", "01", "00" and "10." In reality, due to the factors mentioned above, the initial cell voltage may differ from the center voltage for the data written to the MLC.

Read comparison voltages $V_{R1}$ 211, $V_{R2}$ 212, and $V_{R3}$ 213 are positioned between adjacent center voltages, e.g., positioned at or near the halfway point between adjacent center voltages, and thus define threshold voltages between the voltage ranges 201, 202, 203, 204. During a read operation, read comparison voltages $V_{R1}$ 211, $V_{R2}$ 212, and $V_{R3}$ 213 are applied to determine the cell voltage using a comparison process. However, due to the various factors discussed above, the actual cell voltage, and/or the cell voltage received when reading the MLC, may be different from the respective center voltage $V_{11}$ 201b, $V_{10}$ 202b, $V_{00}$ 203b or $V_{10}$ 204b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drive" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift"

One way to reduce the impact of a cell voltage drifting from one voltage range to an adjacent voltage range is to grey-code the bit-tuples. Grey-coding the bit-tuples includes constraining the assignment of bit-tuples such that a respective bit-tuple of a particular voltage range is different from a respective bit-tuple of an adjacent voltage range by only one bit. For example, as shown in FIG. 2, the corresponding bit-tuples for the adjacent ranges 201 and 202 are respectively "11" and "01", the corresponding bit-tuples for the adjacent ranges 202 and 203 are respectively "01" and "00", and the corresponding bit-tuples for the adjacent ranges 203 and 204 are respectively "00" and "10". Using grey-coding, if the cell voltage drifts close to a read comparison voltage level, the error is typically limited to a single bit within the 2-bit bit-tuple.

Figure 3:
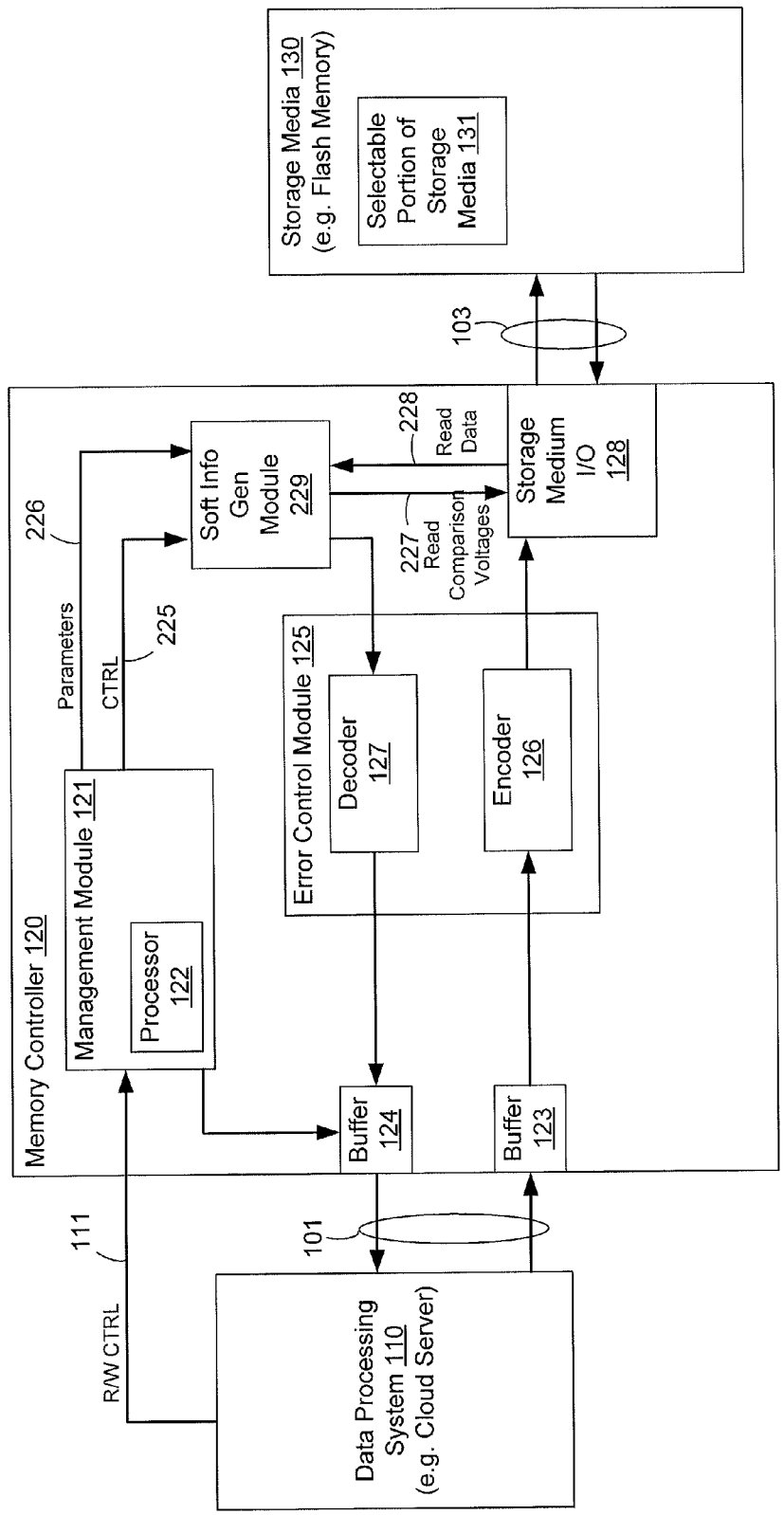
FIG. 3 is a diagram of an implementation of a data storage environment, including a soft information generation module.

FIG. 3 is a diagram of an implementation of a data storage environment 200 that utilizes information from the voltage distributions that occur in multi-level flash memory devices. The data storage environment 200 illustrated in FIG. 3 is similar to and adapted from the data storage environment 100 illustrated in FIG. 1. Elements common to each include common reference numbers, and only the differences between FIGS. 1 and 3 are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein.

To that end, as a non-limiting example, the data storage environment 200, and in particular, the memory controller 120 has been further enabled to utilize at least one of soft information for decoding error control encoded data read from a storage medium 130, statistically determined read comparison signal values associated with one or more characteristics of the storage medium, and statistically determined shifted read comparison signal values associated with one or more characteristics of the storage medium and an identified error condition.

More specifically, the memory controller 120 additionally includes a soft information generation module 229. As described in greater detail below with reference to FIGS. 4 and 7, in some implementations, the soft information generation module 229 generates soft information values for each set of data read from storage medium 130 by utilizing a pre-generated collection of characterization vectors that includes soft information values for bit-tuples that may be read from the storage medium for various combinations of storage medium characterization parameter values. As described in greater detail below with reference to FIGS. 4 and 9, in some implementations, soft information is generated by a device characterization process for memory devices produced by a particular manufacturing process, and stored in a characterization module or look-up table included in soft information generation module 229.

Soft information generation module 229 is coupled to management module 121, error control module 125 and storage medium I/O 128. More specifically, management module 121 is connected to provide soft information generation module 229 a control signal and one or more storage medium characterization parameter values on a control line 225 and a data line 226, respectively. Storage medium I/O 128 is connected to receive read comparison voltages via data line 227, to be provided to storage medium 130 for use when reading data, and to provide soft information generation module 229 raw read data resulting from a read operation via data line 228. Soft information generation module 229 is connected to provide decoder 127 with at least one sequence of soft information corresponding to the raw read data received from storage medium I/O 128. Additionally and/or alternatively, in some implementations, soft information generation module 229 is also connected to provide storage medium I/O 128 with one or more sets of read comparison signal values (e.g., voltage levels or representations of voltage levels, etc.). In some implementations, management module 121 includes soft information generation module 229.

During a write operation, as described above, input buffer 123 receives data to be stored in storage medium 130 from data processing system 110. The data in input buffer 123 is made available to encoder 126, which encodes the data to produce a codeword. The codeword is conveyed to storage medium via storage medium I/O 128, which transfers the codeword to storage medium 130 in a manner dependent on the type of storage medium being utilized. For example, for MLC flash memory, each bit-tuple of the codeword is written into a respective memory cell by changing the charge on the floating gate of the respective memory cell.

A read operation is initiated when the data processing system 110 (or the like) requests data from the storage medium 130 by sending a control signal on the control line 111 to the memory controller 120. In some implementations, the memory controller 120 receives one or more storage medium characterization parameter values, associated with the current state of the storage medium 130, from the data processing system 110 along with the read request. In some implementations, the memory controller 120 retrieves one or more storage medium characterization parameter values, associated with the current state of the storage medium 130, in response to receiving the read request from the data processing system 110. Management module 121 of memory control 120, in turn, passes the read request to soft information generation module 229. In some implementations, the soft information generation module 229 receives one or more storage medium characterization parameter values, associated with the current state of the storage medium 130, along with the read request. In some implementations, soft information generation module 229 retrieves the one or more storage medium characterization parameter values from one of management module 121, data processing system 110 and/or a storage medium characterization parameter value storage module in response receiving the read request. In some implementations, the one or more storage medium characterization parameter values provide an indication of at least one of a physical characteristic associated with at least a portion the storage medium, a mode of operation associated with at least a portion of the storage medium, a history of use associated with at least a portion of the storage medium, a condition characteristic associated with at least a portion of the storage medium, a read type associated with at least a portion of the storage medium, and a location associated with at least a portion of the storage medium. In some implementations, the one or more storage medium characterization parameter values includes an indicator of the storage medium locations being accessed, an indicator of the number of previous program/erase cycles of the storage medium locations being accessed, and an indicator of the current temperature of the storage medium 130.

The soft information generation module 229 retrieves a characterization vector based on the one or more storage medium characterization parameter values and prompts the storage medium I/O 128 to read from a portion of the storage medium 130, such as the selectable portion 131. The storage medium I/O 128 reads from the storage medium and provides a sequence of raw hard-decision read data to the soft information generation module 229. It is worth noting that in some implementations the raw read data can be hard-decision data because the soft information stored in the characterization vectors in the characterization module is in many cases more statistically accurate than the raw electrical analog values read from individual memory cells for a given read operation. Moreover, in contrast to previous systems that required multiple read operations to generate a single set of statistically accurate soft information values, the soft information generation module 229 can generate statistically accurate soft information values using a single-page read operation. In some implementations, the soft information generation module 229 generates a sequence of soft information values corresponding to raw hard-decision read data by selecting a respective soft information value from the selected characterization vector for each bit-tuple in the raw hard-decision data read from the storage medium 130.

Additionally and/or alternatively, during a read operation, the soft information generation module 229 provides statistically determined read comparison signal values to the storage medium I/O 128. Generally, the statistically determined read comparison signal values are selected based on one or more storage medium characterization parameter values associated with the current state of the storage medium 130. As such, for a given current state of the storage medium 130, the statistically determined read comparison signal values may produce more accurate read data than a nominal design value chosen without regard to one or more storage medium characterization parameter values. In some implementations, the statistically determined read comparison signal values are stored in a collection of characterization vectors indexed by one or more storage medium characterization parameter values. As described in greater detail below with reference to FIGS. 4 and 10, in some implementations, the statistically determined read comparison signal values are determined using a characterization process for devices produced by a particular manufacturing process.

Additionally and/or alternatively, in response to an identified error condition after a first read operation, the soft information generation module 229 provides statistically determined shifted read comparison signal values to the storage medium I/O 128. Generally, the statistically determined shifted read comparison signal values are offset relative to either a nominal design value or a first statistically determined read comparison signal value, and based on a set of transition probabilities determined using a characterization process for devices produced by a particular manufacturing process.

Figure 4:
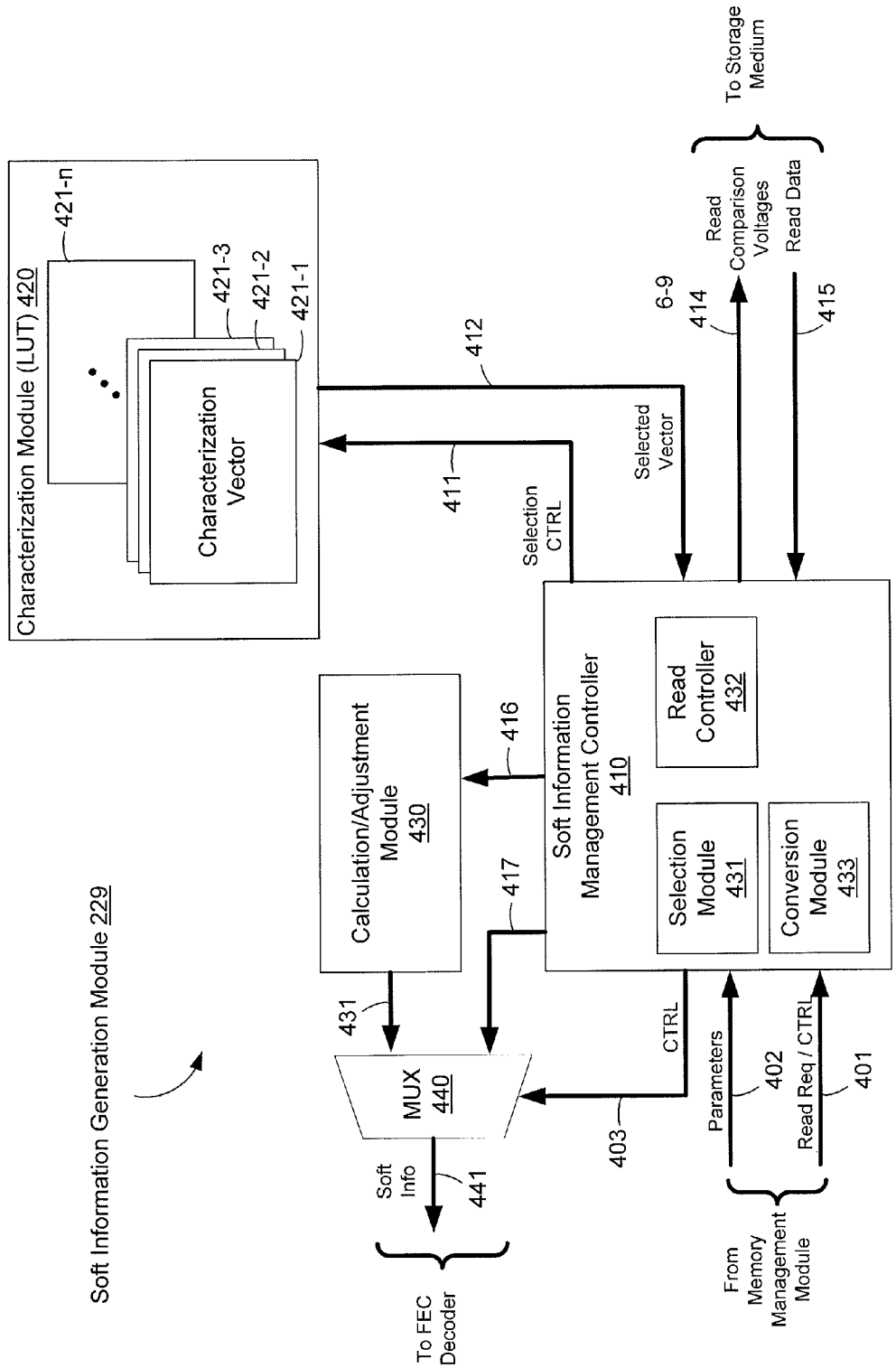
FIG. 4 is a diagram of an implementation of the soft information generation module included in FIG. 3.

FIG. 4 is a diagram of an implementation of the soft information generation module 229 included in FIG. 3. Again, as noted above, while certain specific features are illustrated, those skilled in the art will appreciate from the present disclosure that various other features have not been illustrated for the sake of brevity and so as not to obscure more pertinent aspects of the example implementations disclosed herein. To that end, as a non-limiting example, the soft information generation module 229 includes a soft information management controller 410, a characterization module 420, a calculation/adjustment module 430, and an output multiplex (MUX) 440. As shown in FIG. 3, soft information generation module 229 is coupled to error control module 125, memory management module 120 and storage medium I/O 128.

The soft information management controller 410 is coupled to each of the characterization module 420, calculation/adjustment module 430, and MUX 440 in order to coordinate the operation of soft information generation module 229. More specifically, soft information management controller 410 is connected to receive a read request and one or more storage medium characterization parameters on control and data lines 401 and 402, respectively. Soft information management controller 410 is also connected to provide characterization module 420 a selection control signal on control line 411, and to receive a selected characterization vector on data line 412. In some implementations, soft information management controller 410 is further connected to provide read comparison signal values (e.g., comparison voltages or another electrical signals) to the storage medium I/O 128 via data line 414, and receive raw read data from the storage medium I/O 128 via data line 415. Soft information management controller 410 is also connected to provide sequences of soft information values to the calculation/adjustment module 430 and output MUX 440 via corresponding data lines 416 and 417, and a control signal to output MUX 440 via control line 403. Output MUX 440 is also connected to receive an adjusted sequence of soft information values from calculation/adjustment module 430 on data line 431. Output MUX 440 is connected to selectively provide soft information values from one of conversion module 433 and calculation/adjustment module 430 on data line 441 depending on the control signal received on control line 403.

Characterization module 420 includes a collection of characterization vectors 421-1, 421-2, 421-3, ... 421-n, that each store characterization data, such as soft information values for bit-tuples and read comparison signal values, associated with storage medium 130 for one or more storage medium characterization parameter values. In some implementations, the characterization data stored in the characterization vectors 421 is statistically derived. More detailed example implementations of characterization vectors 421 are described below with reference to FIGS. 5A, 5B, 6A and 6B.

Soft information management controller 410 includes a selection module 431, a read controller 432, and a conversion module 433. The selection module 431 is configured to use the one or more storage medium characterization parameters values to select a characterization vector from the stored collection of characterization vectors 421-1, 421-2, 421-3, ... 421-n in accordance with the current state of storage medium 130. In some implementations, the selection control signal includes one or more of storage medium characterization parameters values and/or an index key associated with a combination of one or more of storage medium characterization parameters values that enables characterization module 420 to select a characterization vector based on the one or more storage medium characterization parameters values associated with the current state of the storage medium 130.

The read controller 432 is configured to read a portion of the storage medium 130 via storage medium I/O 128. In some implementations, the read controller 432 is configured to provide storage medium I/O 128 with read comparison signal values for the read operation. In some implementations, for a first read, read controller 432 selects one or more statistically determined read comparison signal values from a characterization vector selected based on the one or more storage medium characterization parameter values associated with the current state of storage medium 130. In some implementations, read controller 432 is configured to read the same portion of the storage medium 130 a second time in response to a determination that the soft information values generated from the first read included an error that was uncorrectable by error control decoder 127. For the second read, read controller 432 selects one or more shifted read comparison signal values from the selected characterization vector. In some implementations, the shifted read comparison signal values individually offset relative to a respective nominal or default read-signal value or a statistically determined first read comparison signal value based on set of transition probabilities, as discussed in greater detail below with reference to FIG. 8. Even though the same portion of the storage medium is read a second time, without having been written to after the first read, in some circumstances the use of one or more shifted read comparison signal values during the second read produces raw hard-decision read data read from storage medium 130 that is different from the raw hard-decision read data read as a result of the first read operation.

Conversion module 433 is configured to generate a sequence of soft information values corresponding to raw hard-decision read data. The sequence of soft information values is generated, at least in part, by selecting a respective soft information value from the selected characterization vector for each bit-tuple of the raw hard-decision read data. More specifically, in some implementations for a first read, the conversion module 433 assigns at least one soft information value, in the form of a LLR, to each bit-tuple in the hard-decision read data from the first read to produce a first sequence of LLRs $y_{LLR}^{(1)} = (y_0^{(1)}, y_1^{(1)}, \ldots, y_{n-1}^{(1)})$, where n is the codeword length. In some implementations, if the first sequence of soft information values is determined to include an uncorrectable error, conversion module 433 assigns at least one soft information value, in the form of a LLR, to each bit-tuple in the hard-decision read data from the second read to produce a second sequence of soft information values, LLRs $y_{LLR}^{(2)} = (y_0^{(2)}, y_1^{(2)}, \ldots, y_{n-1}^{(2)})$, where n is the codeword length.

Calculation/adjustment module 430 is configured to generate a third sequence of soft information values by combining the first and second sequences of soft information values. In some implementations, the third sequence of soft information values is generated in response to a determination that the second sequence of soft information values includes at least one uncorrectable error. In some implementations, the third sequence of soft information values is generated when the information from at least a portion of the second sequence of soft information values becomes available. As discussed in greater detail below, with reference to FIG. 7, in some implementations, each soft information value of the third sequence of soft information values is generated by comparing corresponding soft information values from the first and second sequences, and equating the respective one of the third sequence of soft information values to a first combination of the first and second soft information values when the comparison satisfies a first condition, and equating the respective one of the third sequence of soft information values to a second combination of the soft information values when the comparison satisfies a second condition.

As an example, in some implementations, the third sequence of soft information values is a third (and final) sequence of LLRs $y_{LLR}^{(f)} = (y_0^{(f)}, y_1^{(f)}, \ldots, y_{n-1}^{(f)})$, where n is the codeword length generated according to equation (1):

$$y_i^{(f)} = \begin{cases} y_i^{(2)}, & \text{if } \operatorname{sgn}(y_i^{(1)}) = \operatorname{sgn}(y_i^{(2)}) \\ \alpha_1 \cdot y_i^{(1)} + \alpha_2 \cdot y_i^{(2)}, & \text{if } \operatorname{sgn}(y_i^{(1)}) \ne \operatorname{sign}(y_i^{(2)}), \end{cases} \quad (1)$$

where $\alpha_1$ and $\alpha_2$ are weighting factors that satisfy $\alpha_1 + \alpha_2 = 1$ (or some equivalent constant). In some implementations, the two weighting factors are pre-determined constants, while in other implementations they are generated based on the two sequences of LLRs, $y_{LLR}^{(1)}$ and $y_{LLR}^{(2)}$. As shown in equation one, a first combination of the soft information values comprises only one of the first and second soft information values, while the second combination of the soft information values comprises a weighted combination of the first and second soft information values.

For example, in some implementations, weighting factors $\alpha_1$ and $\alpha_2$ are generated as:

$$\alpha_1 = \frac{|y_i^{(1)}|}{|y_i^{(1)}| + |y_i^{(2)}|}; \quad (2)$$

and $$\alpha_2 = \frac{|y_i^{(2)}|}{|y_i^{(1)}| + |y_i^{(2)}|} \quad (3)$$

In some implementations, the decoded data, based on the final sequence of LLRs, $y_{LLR}^{(f)}$, is not tested to determine if the decoding was successful. Instead, without regard to any such determination, the resultant decoded data is sent to data processing system 110 (FIG. 1, 3). As such, in some implementations the soft information provided by soft information generation module 229 in response to a read request from data processing system 110 is limited to the first, second and third sequences of LLRs generated from two read operations. Those skilled in the art will appreciate from the present disclosure that a greater number of read operations is possible, and that each subsequent read operation increases the maximum amount of time required to complete a read operation, sometimes called the maximum latency. Even if maximum latency is rarely encountered, data processing system 110 must be designed to accommodate the maximum latency of memory controller 120. Typically, shorter maximum latencies are preferred over longer maximum latencies.

In some implementations, LLRs can be generated from transition probabilities, which are determined by statistically characterizing samples of memory devices, under various conditions, produced by a manufacturing process. To that end, a basis for a characterization process may be established as follows. Let X be the set of $Q=2^q$ levels on which a q-bit bit-tuple is written to a flash memory cell, where each of the q-bits is from a respective one of q-pages. For example, when q=2, X={11, 01, 00, 10}. In another example, when q=3, X={111, 011, 001, 000, 010, 110, 100, 101}. Let Y be the set of Q levels that a q-bit bit-tuple is read out from the flash memory cell based on read comparison voltages, such as the read comparison voltages $V_{R1}$, $V_{R2}$ and $V_{R3}$ described above with reference to FIG. 2. Due to pseudo-random fluctuations, defects in the storage medium, operating conditions, device history, and/or write-read circuitry, etc., the read out voltage level from a flash memory cell y∈Y may be different from the written voltage level x∈X. The set of actual voltages for each level in memory cell typically has a distribution or set of possible values, as described above with reference to FIG. 2. The voltage distributions are affected by factors such as page location, page type, program/erase (P/E) cycles, data mode (operation, retention), temperature, etc. In some implementations, the voltage distribution and the variation of the voltage distribution may be used to generate soft information values, such as transition probabilities and/or LLRs, based on a device characterization process.

The following describes an example in which q=2 (i.e., 2 bits per cell in a MLC flash memory) to describe an implementation of a soft information generation method. However, those skilled in the art will appreciate from the present disclosure that the 2-bit implementation may be extended to other types of MLC flash memory that more bits (q≥3) per memory cell.

Each combination of storage medium characterization parameter values represents a respective state of a storage medium (e.g., flash memory device) that may be characterized in a device characterization process, and may exist for other devices produced by the same manufacturing process. As described below with reference to FIGS. 9-11, in order to characterize a storage medium for a set of characterization parameter value combinations, data is written and read from the storage medium under test conditions that approximate each of characterization parameter value combinations, including various modes of operation (e.g., operation mode, retention mode, etc.).

With respect to MLC flash memory (e.g., storage media 130), there are generally two types of read operations that may be performed on MLC flash memory that result in disjoint sets of transition probabilities. One is a single-page read, which includes reading the respective bits of a particular page from a number of q-page MLC flash memory cells. For example, for a 2-page flash memory, the two constituent pages are referred to as the lower page and the upper page, where the lower page bit is typically the least significant bit of the 2-bit bit-tuple, and the upper page is the most significant bit. For the single-page read scenario, one of the upper page and lower page bit from a number of MLC flash memory cells is read. Thus, a lower-page read delivers a sequence of respective lower-page bits from a number of 2-page MLC flash memory cells. The other type of read is a joint-page read, which generally includes reading the respective bits of two or more pages from a number of q-page MLC flash memory cells. So for a 2-page (i.e., q=2) flash memory, a joint-page read delivers a sequence of respective 2-bit bit-tuples from a number of 2-page MLC flash memory cells. For each type of read, and a combination of storage medium characterization parameter values, one or more transition probabilities tables is generated by comparing write data and read data.

FIG. 5A, for example, is a transition probability table 50 associated with either a SLC flash memory cell or a single-page read of a MLC flash memory cell for a particular combination of storage medium characterization parameter values. The transition probability values $p_{00}$, $p_{10}$, $p_{01}$, $p_{11}$ in the transition probability table 50 is determined as follows. Let $x_b$ and $y_b$ be the data bit written to a lower page and the data read from the same lower page, respectively. Each transition probability $p_{00}$, $p_{10}$, $p_{01}$, $p_{11}$ is determined as a conditional probability $p_{i,j}=p(y_b=j|x_b=i)$ that a particular bit value $y_b=j$ is read when the bit $x_b=i$ was written. For example, the transition probability $p_{00}$ is the probability that a "0" was read when a "0" was written, and the transition probability $p_{01}$ is the probability that a "1" was read when a "0" was written, etc. Moreover, the transition probabilities, and subsequently the LLRs, generated for a single-page read correspond to bit-tuples each including a single bit even though a MLC flash memory cell stores a bit-tuple including two or more bits. Those skilled in the art will appreciate from the present disclosure that the transition probability table for the upper page is similarly obtained by writing and reading upper page data for a combination of storage medium characterization parameter values. Those skilled in the art will also appreciate from the present disclosure that for each of the possible write bit values, the transition probabilities satisfy equation (4):

$$\Sigma_{j=0}^{2^q-1} p_{ij}=1 \quad (4)$$

FIG. 6A is a transition probability table 60 that is associated with a joint-page read of a MLC flash memory cell. Again, a joint-page read generally includes reading the respective bits of two or more pages from a number of q-page MLC flash memory cells. Consequently, the sequence of read data includes multi-bit bit-tuples, and the transition probabilities and the LLRs generated for a joint-page read correspond to bit-tuples each including two or more bits. Accordingly, for a 2-page MLC flash memory the bits for both the upper page and lower page are read together, e.g., by determining the voltage level produced by a 2-bit flash memory cell during a read operation. Again, the characterization process includes comparing the read out levels y∈Y with the write levels x∈X, and the transition probability $p_{i,j}=p(y=j|x=i)$ is the conditional probability of read out level y=j given the written level x=i. Additionally, for the joint-page read the write and read levels {11, 01, 00, 10} are mapped to a respective index {3, 1, 0, 2} in the table. Thus, for example, the transition probability $p_{13}$ is the probability that a "3" (or "11") was read when a "1" (or "01") was written. Further, as described above, for each write level the transition probabilities satisfy equation (4).

Once the transition probabilities have been generated for a combination of storage medium characterization parameter values, corresponding LLRS may be generated and stored in a collection of characterization vectors. Those skilled in the art will appreciate from the present disclosure that, in some implementations, the transition probabilities are stored in a collection of characterization vectors instead of, or in addition to, the LLRs. However, LLRs provide a more compact representation of the soft information provided by the transition probabilities.

In some implementations, the LLRs for a combination of storage medium characterization parameter values may be generated using equation (5) as follows:

$$LLR(y_k) \equiv \log \frac{P(x_k = 0 | y)}{P(x_k = 1 | y)} \quad (5)$$

In equation (5), $y_k$ represents the k-th bit read from a q-bit multi-level memory cell, which corresponds to a read out voltage level y∈Y for 0≤k<q. Equation (5) can be rewritten as (5a), in which $X_k^{(0)}$ denotes the subset of the voltage levels X where the k-th bit is 0, $X_k^{(1)}$ denotes the subset of the voltage levels X where the k-th bit is 1, and $X_k^{(0)} \cup X_k^{(1)} = X$.

$$LLR(y_k) = \log \frac{\sum_{\alpha \in X_k^{(0)}} P(y | x = \alpha)}{\sum_{\alpha \in X_k^{(1)}} P(y | x = \alpha)} \quad (5a)$$

For a single-page read, equation (5a) simplifies to equations (6) and (7):

$$LLR(y_b = 0) = \log \frac{P(y_b = 0 | x_b = 0)}{P(y_b = 0 | x_b = 1)} = \log \frac{p_{00}}{p_{10}} \quad (6)$$

$$LLR(y_b = 1) = \log \frac{P(y_b = 1 | x_b = 0)}{P(y_b = 1 | x_b = 1)} = \log \frac{p_{01}}{p_{11}} \quad (7)$$

For a joint-page read, equation (5a) does not simplify as concisely as above for $y_b=0$ and $y_b=1$. However, as an example for y=11, equation (5a) may be written as:

$$LLR(y_0) = \log \frac{P(y = 11 | x = 00) + P(y = 11 | x = 10)}{P(y = 11 | x = 11) + P(y = 11 | x = 01)} \quad (8)$$

$$LLR(y_1) = \log \frac{P(y = 11 | x = 01) + P(y = 11 | x = 00)}{P(y = 11 | x = 11) + P(y = 11 | x = 10)} \quad (9)$$

Those skilled in the art will appreciate from the present disclosure, and in particular equations (5a), (8) and (9), how to obtain the LLRs for y=01, 00, and 10.

FIG. 5B is a schematic diagram of an implementation of a characterization vector 500 (e.g., corresponding to any one of the characterization vectors 421 shown in FIG. 4); in some implementations, characterization vector includes soft information values 532, 533 produced from transition probability values in table of FIG. 5A. In some implementations, characterization vector 500 includes a storage medium characterization parameters field 510, a read comparison voltages field 520, a single-page read LLR value field 530 and a weighting factors field 540. With further reference to FIGS. 3 and 4, in some implementations, a characterization vector is a data structure that facilitates reading raw data values from a storage medium and/or generating a sequence of soft information values corresponding to the read data. In some implementations, respective LLR values (e.g., $LLR(y_b=0)$ and $LLR(y_b=1)$) for a single-page read and/or a joint-page read are stored in a respective characterization vector for a combination of storage medium characterization parameter values for devices created from a particular manufacturing process. In turn, a memory controller, or a soft information generation module of a memory controller, generates a sequence of soft information values corresponding to raw read data by selecting a respective LLR value from a selected characterization vector for each bit-tuple of the read data. As noted above, in some implementations the raw read data is hard-decision data because pre-generated soft information, such as LLRs, may be more statistically accurate than the raw electrical values read from individual memory cells for a given read operation. The greater statistically accuracy is a result of a controlled device characterization process.

The storage medium characterization parameters field 510 is provided to store one or more storage medium characterization parameter values. For example, the storage medium characterization parameters field 510 includes a temperature field 511 and a P/E cycles field 512. However, those skilled in the art will appreciate from the present disclosure that any number of storage medium characterization parameter value fields may be included in the storage medium characterization parameters field 510. For example, without limitation, the set of one or more storage medium characterization parameter values provides an indication of at least one of a physical characteristic associated with at least a portion the storage medium, a mode of operation associated with at least a portion of the storage medium, a history of use associated with at least a portion of the storage medium, a condition characteristic associated with at least a portion of the storage medium, a read type associated with at least a portion of the storage medium, and a location associated with at least a portion of the storage medium. As noted above, the storage medium characterization parameter values in field 510 correspond to a state of the storage medium for which the remaining data in characterization vector 500 is applicable. As such, in some implementations, a collection of characterization vectors may be indexed, and thus made searchable and selectable, by one or more storage medium characterization parameter values stored in the respective fields.

In some implementations, characterization vector 500 does not include storage medium characterization parameters field 510, and instead the storage medium characterization parameter values corresponding to characterization vector 500 are implied by the location of characterization vector 500 in a table or database of characterization vectors. For example, if there are three storage medium characterization parameters (a, b and c), having, 3, 4 and 5 potential values, respectively, there will a set of 60 (i.e., 3×4×5) distinct characterization vectors for 60 distinct states of the storage medium. Any one of the 60 characterization vectors is accessed by forming an index from the three storage medium characterization parameters (a, b and c) corresponding to the current state of the storage medium, and reading or otherwise obtaining the characterization vector corresponding to that index.

The read comparison voltages field 520 is provided to store read comparison voltages and/or indications of read comparison voltages applicable to a respective state of a storage medium characterized by the one or more storage medium characterization parameter values used to define characterization vector 500. In some implementations, the read comparison voltages field 520 includes comparison voltages for different read operations. For example, the read comparison voltages field 520 includes a first read comparison voltages field 521 and a second read comparison voltages field 522. The first read comparison voltages in field 521 are used during the first read of a set of flash memory cells. The first read is sometimes called the "normal read." In some implementations, the first read comparison voltages are default read comparison voltage values, such as default read comparison voltage values for devices produced using a particular manufacturing process. In some other implementations, the first read comparison voltages field 521 includes first statically determined read comparison voltage values, $V_{R1-1}$ 521a, $V_{R2-1}$ 521b and $V_{R3-1}$ 521c, which are generated by a characterization process for devices produced by a particular manufacturing process. For example, in some embodiments, the first read comparison voltage values are selected during a device characterization process to satisfy a respective threshold error rate. In some implementations, the second read comparison voltages field 522 includes first statically determined shifted read comparison voltage values, $V_{R1-2}$ 522a, $V_{R2-2}$ 522b and $V_{R3-2}$ 522c, which are offset relative to a nominal read comparison signal value or the statistically determined first read comparison signal value based on set of transition probabilities, and used in response to an identified error condition. As described above, a second read, using the shifted read comparison voltage values, is typically performed only if the first read produces data having one or more uncorrectable errors (i.e., uncorrectable by error control module 125 unless data is received from one or more additional read operations). In some implementations, the read comparison voltages field 520 includes actual read comparison voltage levels, such as read comparison voltages $V_{R1}$, $V_{R2}$ and $V_{R3}$ described above with reference to FIG. 2. In some implementations, the read comparison voltage field 520 includes an indication of the read comparison voltages, such as an offset value, a percentage value and/or a discretized value.

The single-page read LLR value field 530 stores lower page LLR values 532 and upper page LLR values 533 for respective lower and upper page reads, which are indexed by read data values 531 (e.g., "0" and "1"). Sequences of soft information are generated from raw read data by selecting the appropriate LLR value for each bit-tuple in the read data. For example, for a lower page read, a respective one of the lower page LLR values 532 would be selected for each bit of raw data.

As described above, in response to an identified error condition (e.g., an uncorrectable error in the data produced by a second read), first and second sequences of soft information values are combined to produce a third sequence of soft information values. In some implementations, the combination of the first and second sequences of soft information values utilizes weighting factors stored in characterization vector 500. The weighting factors field 540 includes lower page weighting factors 541 for lower page reads and upper page weighting factors 542 for upper page reads.

FIG. 6B is a schematic diagram of an implementation of a characterization vector 600 (e.g., corresponding to any one of the characterization vectors 421 shown in FIG. 4); in some implementations, characterization vector 600 includes soft information values 632, 633 produced from the transition probability values in table of FIG. 6A. The characterization vector 600 illustrated in FIG. 6B is similar to characterization vector 500 illustrated in FIG. 5B. Elements common to both characterization vectors have been assigned the same reference numbers, and only the differences between the characterization vectors 500 and 600, shown in FIGS. 5B and 6B, are described herein for the sake of brevity. Moreover, while certain specific features are illustrated, those skilled in the art will appreciate from the present disclosure that various other features have not been illustrated for the sake of brevity and so as not to obscure more pertinent aspects of the example implementations disclosed herein.

As compared to characterization vector 500, characterization vector 600 includes a joint-page read LLR value field 630 that stores lower page LLR values 632 and upper page LLR values 633 for respective lower and upper page reads, which are indexed by read data values 631. As described above, sequences of soft information are generated from raw read data by selecting the appropriate pair of LLR values for each bit-tuple in the read data. Additionally, in some implementations, the weighting factor field 640 stores weighting factors 641a, 641b applicable to both lower page and upper page reads.

Figure 7:
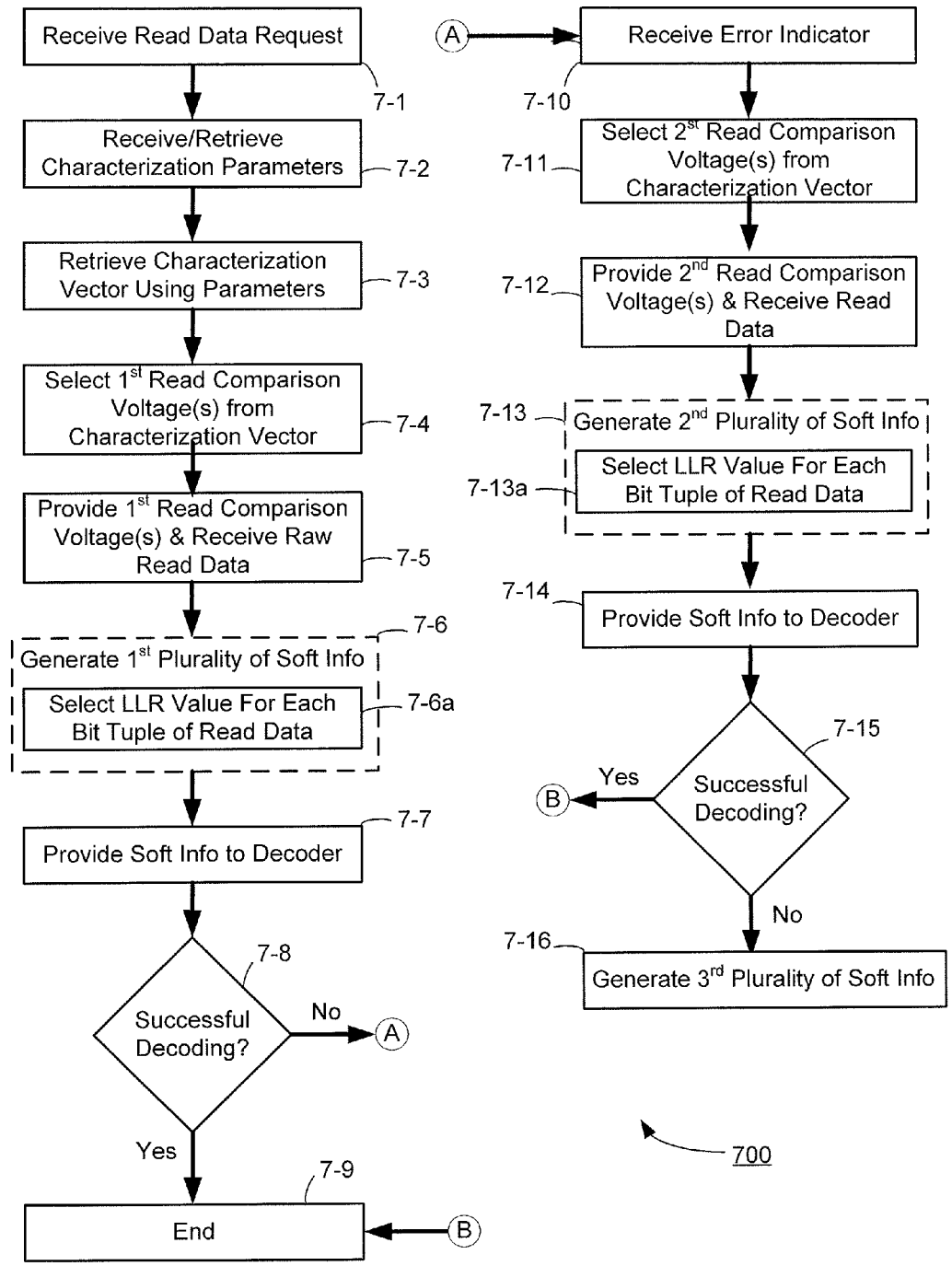
FIG. 7 is a flowchart representation of an implementation of a method of generating soft information values from data read from a storage medium.

FIG. 7 is a flowchart representation of a method 700 of generating soft information values from data read from a storage medium. In some implementations, method 700 is performed by a memory controller or a module associated with a memory controller. Briefly, method 700 includes reading data from a storage medium using one or more read comparison signal values, selected based on the current state of the storage medium, generating a corresponding sequence of soft information values from the read data and the current state of the storage medium, and determining whether to produce one or more additional sequences of soft information values. As noted above, in some implementations, the read comparison signal value(s) and soft information values for various bit-tuples are stored in characterization vectors that are selectable based on one or more storage medium characterization parameter values. In turn, sequences of soft information values generated from raw read data, are based on one or more storage medium characterization parameter values associated with the current state of the storage medium (e.g., a flash memory).

To that end, as represented by block 7-1, method 700 includes receiving a read data request. For example, with further reference to FIGS. 3 and 4, the memory controller 120 receives a read data request from data processing system 110, and passes the request to soft information generation module 229. As represented by block 7-2, method 700 includes receiving or retrieving one or more storage medium characterization parameter values associated with a current state of the storage medium. In some implementations, one or more of the storage medium characterization parameter values are received with the read data request. In some implementations, one or more of the storage medium characterization parameter values are retrieved in response to receiving the read data request.

As represented by block 7-3, method 700 includes using the one or more one or more storage medium characterization parameter values to retrieve a characterization vector (e.g., vector 421, 500 or 600, shown in FIG. 4, 5B or 6B, respectively). For example, with further reference to FIG. 4, the soft information management controller 410 uses the one or more storage medium characterization parameter values to transmit a selection control signal on control line 411 to characterization module 420. In response, the characterization module 420 provides at least a portion of a characterization vector (corresponding to the one or more storage medium characterization parameter values) to the soft information management controller 410 via data lien 412.

As represented by block 7-4, method 700 includes selecting one or more first read comparison voltages from the selected characterization vector. In turn, as represented by block 7-5, method 700 includes providing the selected one or more first read comparison voltages (as well as an address or other location value) to the read circuitry (e.g., storage medium I/O 128) and receiving raw read data (e.g., a codeword) from storage medium 130. As represented by block 7-6, method 700 includes generating a first sequence of soft information values by assigning at least one soft information value from the characterization vector (retrieved at 7-3) to each bit-tuple in the raw read data from the first read. More specifically, as represented by block 7-6a for example, a first sequence of LLRs $y_{LLR}^{(1)} = (y_0^{(1)}, y_1^{(1)}, \ldots, y_{n-1}^{(1)})$, may be generated by assigning at least one LLR value to each bit-tuple in the raw data.

As represented by block 7-7, method 700 includes providing the raw read data (e.g., a codeword) read from storage medium 130 and the corresponding first sequence of soft information values to an ECC decoder (e.g., decoder 127, FIG. 3). As represented by block 7-8, method 700 includes determining whether the ECC decoder successfully decoded the codeword using the first sequence of soft information values. If the decoding is successful ("Yes" path from block 7-8), as represented by block 7-9, method 700 ends for the codeword corresponding to the first sequence of soft information values because no further action is required to read the associated data successfully. On the other hand, if the decoding is not successful ("No" path from block 7-8), as represented by block 7-10, method 700 includes receiving an error indicator. In turn, as represented by block 7-11, method 700 includes selecting one or more second read comparison voltages from the previously selected characterization vector. In turn, as represented by block 7-12, method 700 includes providing the selected one or more second read comparison voltages to the read circuitry (e.g., storage medium I/O 128) and receiving a new set of raw read data from storage medium 130. As represented by block 7-13, method 700 includes generating a second sequence of soft information values by assigning at least one soft information value from the characterization vector to each bit-tuple in the raw read data from the second read. More specifically, as represented by block 7-13a, in some implementations a second sequence of LLRs, $y_{LLR}^{(2)} = (y_0^{(2)}, y_1^{(2)}, \ldots, y_{n-1}^{(2)})$, is generated by assigning at least one LLR value to each bit-tuple in the raw data.

As represented by block 7-14, method 700 includes providing the second sequence of soft information values to an ECC decoder (e.g., decoder 127, FIG. 3). As represented by block 7-15, method 700 includes determining whether the ECC decoder successfully decoded the codeword (obtained from the second read) using the second sequence of soft information values. If the decoding is successful ("Yes" path from block 7-15), as represented by block 7-9, method 700 ends for the codeword from the second read because no further action is required to read the associated data successfully. On the other hand, if the decoding is not successful ("No" path from block 7-15), as represented by block 7-16, method 700 includes generating a third sequence of soft information values by combining the first and second sequences of soft information values as describe above with reference to equations (1) and (2), and further described below with reference to FIG. 8.

Figure 8:
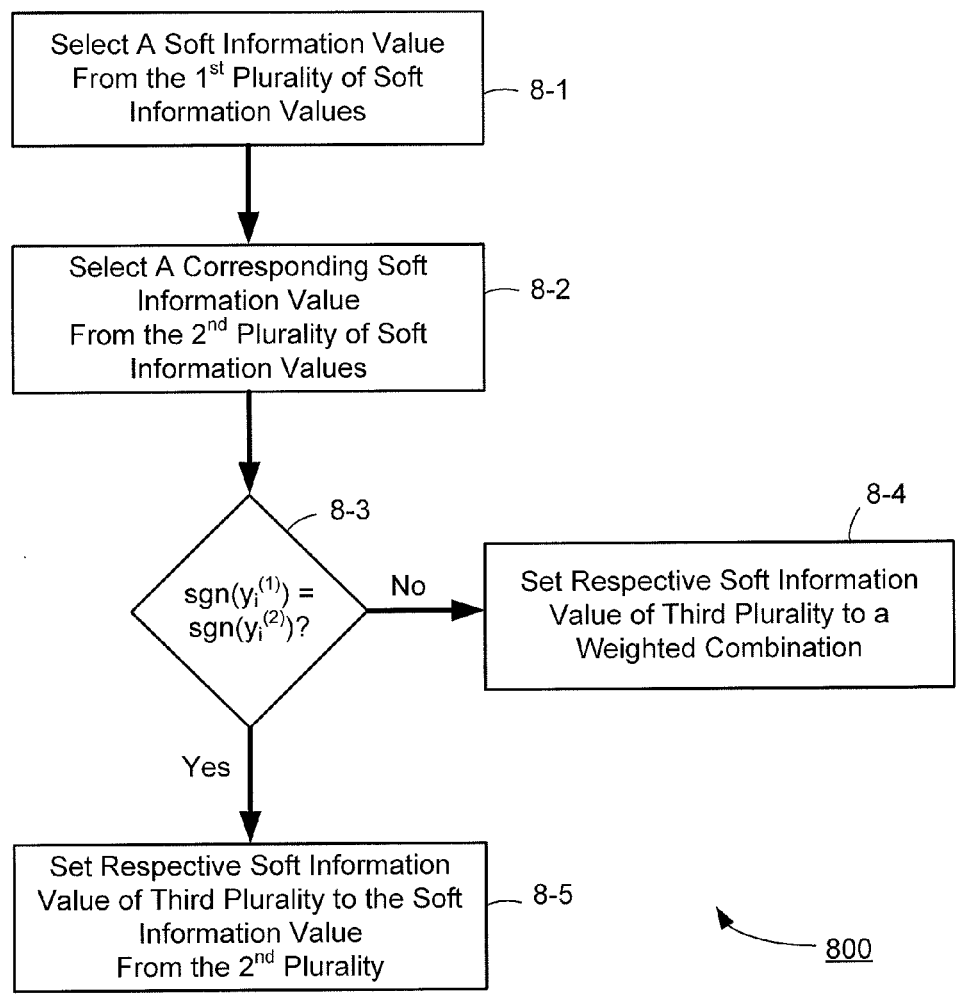
FIG. 8 is a flowchart representation of an implementation of a method of generating soft information values from previously generated soft information values.

FIG. 8 is a flowchart representation of an implementation of a method 800 of generating soft information values from previously generated soft information values. In some implementations, method 800 is performed by a memory controller or a module associated with a memory controller. Briefly, method 800 includes generating a third sequence of soft information values based on a combination of two previously generated sequences of soft information values. To that end, as represented by block 8-1, method 800 includes selecting a soft information value from the first sequence of soft information values previously generated, and as represented by block 8-2, selecting a corresponding soft information value from the second sequence of soft information values previously generated. As represented by block 8-3 and with reference to equation (1) above, method 800 includes determining whether the signs (i.e., positive or negative) of the selected soft information values from the first and second sequences match. If the signs match (e.g., both are positive or both are negative numbers), as represented by block 8-5, method 800 includes setting or equating the respective soft information value of the third sequence to the soft information value selected from only the second sequence of soft information values ("Yes" path from block 8-5). On the other hand, if the signs do not match, as represented by block 8-4 and with reference to equations (1), (2) and (3), method 800 includes setting or equating the respective soft information value of the third sequence to a weighted combination of values selected from the first and second sequences of soft information values.

Figure 9:
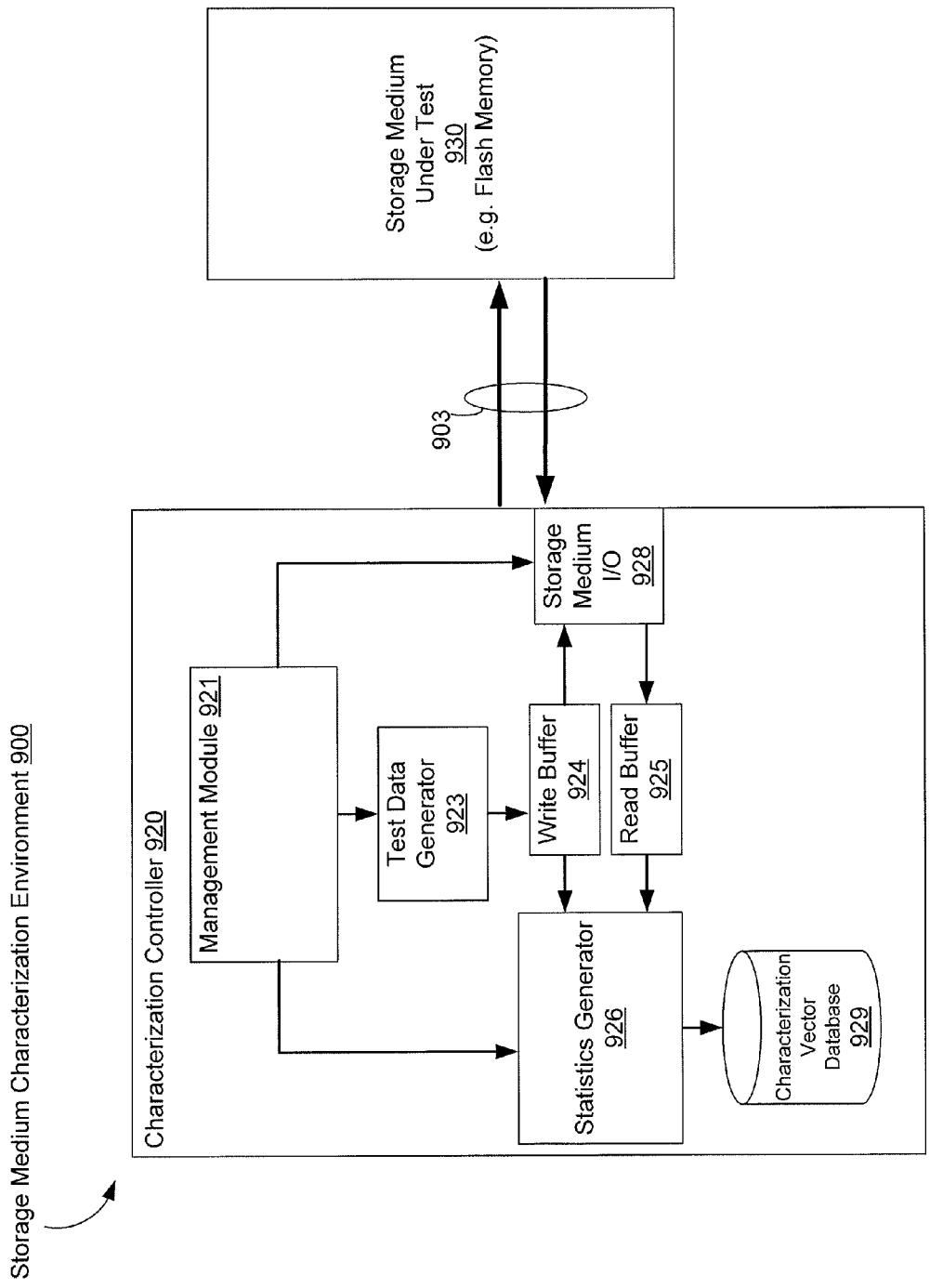
FIG. 9 is a diagram of an implementation of a characterization environment operable to generate soft information values and read comparison voltages for a storage medium.

FIG. 9 is a diagram of an implementation of a storage medium characterization environment 900 operable to generate soft information values and statistically determined read comparison signal values for a storage medium, such as a MLC flash memory. While certain specific features are illustrated, those skilled in the art will appreciate from the present disclosure that various other features have not been illustrated for the sake of brevity and so as not to obscure more pertinent aspects of the example implementations disclosed herein. To that end, as a non-limiting example, the characterization environment 900 includes a storage medium under test 930 and a characterization controller 920.

The storage medium under test 930 includes one or more memory devices (e.g., MLC flash memory devices) produced by the same manufacturing process. The characterization controller 920 includes a management module 921, a test data generator 923, a statistics generator 926, a storage medium I/O 928, a write buffer 924, a read buffer 925, and a characterization vector database 929.

In some implementations, characterization controller 920 includes one or more processors (not shown) for executing one or more programs, including management module 921, test data generator 923, and statistics generator 926. In some implementations, management module 921, test data generator 923, and statistics generator 926 are programs stored in a non-volatile computer readable storage medium (not shown), such as one or more DRAM devices and/or non-volatile memory devices, and the non-volatile computer readable storage medium is coupled to the one or more processors by one of more communication busses (not shown). Management module 921 is coupled to statistics generator 926, test data generator 923 and storage medium I/O 128 in order to coordinate operation of the characterization controller 920. Storage medium I/O 928 provides an interface to the storage medium under test 930 though data connections 903. In some implementations, storage medium I/O 928 includes read and write circuitry, including circuitry capable of providing read comparison signal values, such as voltages, to signal lines coupled to the storage medium under test 930. Write buffer 924 and read buffer 923 are coupled in parallel between I/O 928 and statistics generator 926. Write buffer 924 and read buffer 923 are readable by statistics generator 926. Write buffer 924 is readable by the storage medium I/O 928, and read buffer 923 is writable by storage medium I/O 928. Additionally, write buffer 924 is writable by test data generator 923. Statistics generator 926 is capable of writing characterization vectors to characterization vector database 929.

In operation, for each type of read and for a specified set of storage medium characterization parameter values, one or more transition probability tables are generated by comparing write data and read data. To that end, test data generator 924 provides write data to the write buffer 924. The storage medium I/O 928 writes the data in the write buffer 924 to the storage medium under test 930. In turn, storage medium I/O 928 reads the data from the storage medium under test 930 and provides the read data to read buffer 923. The statistics generator 926 compares the contents of write buffer 924 and read buffer 923 to determine the presence and location of errors in the read data. The process is repeated multiple times, within the bounds of the one or more storage medium characterization parameter values corresponding to a characterization vector, in order to produce a statistically significant amount of test data from which transition probability values, LLR values and statistically based read comparison voltages can be calculated for inclusion the characterization vector.

Figure 10:
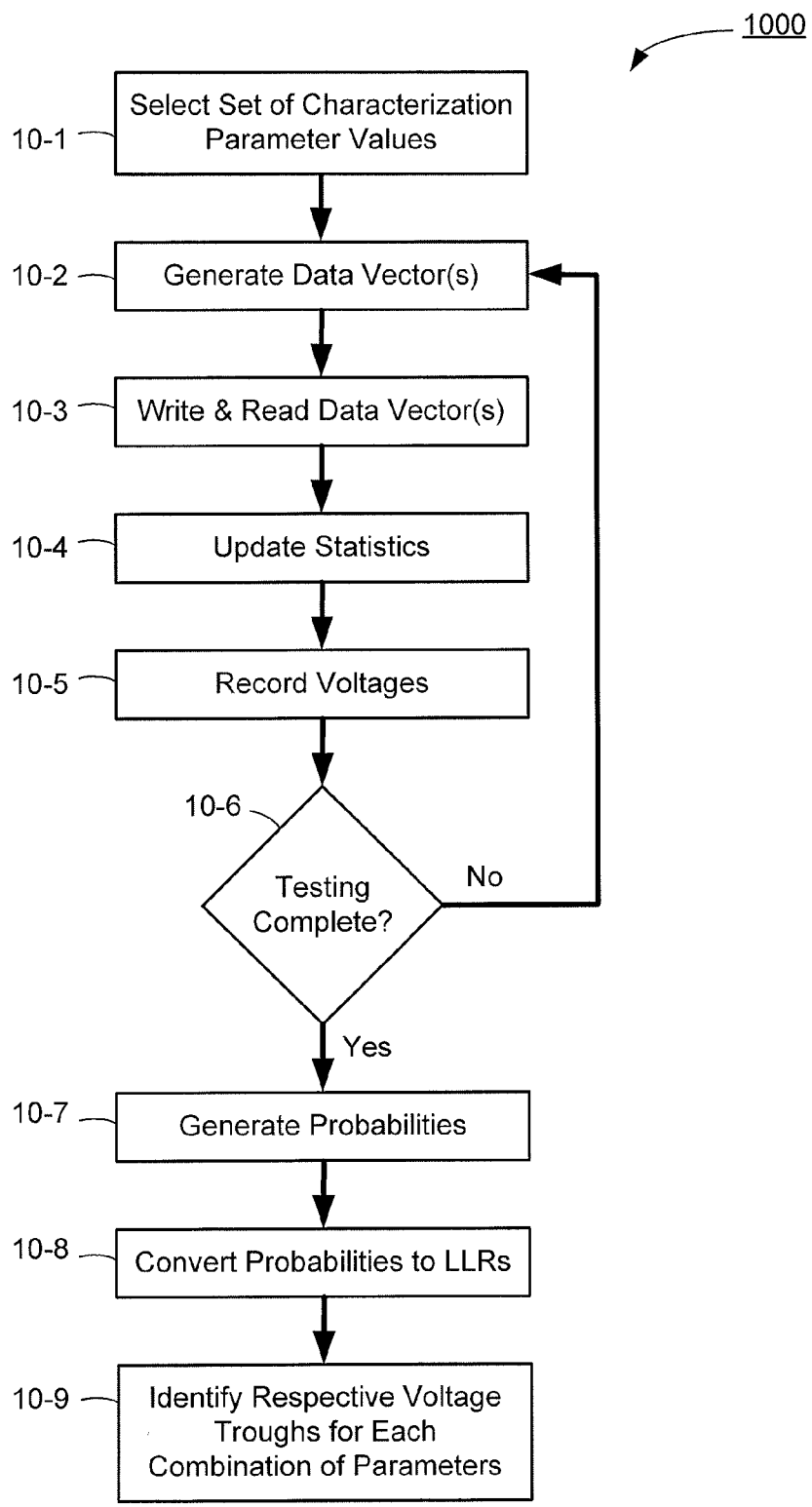
FIG. 10 is a flowchart representation of an implementation of a method of generating one or more characterization vectors.

FIG. 10 is a flowchart representation of a method 1000 of generating one or more characterization vectors, including soft information values and read comparison voltages based on characterization data, in accordance with some embodiments. In some implementations, method 1000 is performed by a module associated with a memory controller. Briefly, method 1000 includes statistically characterizing memory devices produced by a particular manufacturing process.

To that end, as represented by block 10-1, method 1000 includes selecting a set (sometimes herein called the specified set) of one or more storage medium characterization parameter values in order to define testing conditions for a characterization vector. As represented by block 10-2, method 1000 includes generating data vectors (i.e., test data). In some implementations, the data vectors are pseudo-randomly generated. As represented by block 10-3, method 1000 includes writing and reading the data vectors. As represented by block 10-4, method 1000 includes recording the presence and location of errors in the read data vectors and generating statistics associated with the presence and location of errors in the read data vectors. As represented by block 10-5, method 1000 includes recording the raw read voltage values, corresponding to the stored data vectors after a write and read. As represented by block 10-6, method 1000 includes determining if sufficient data has been collected for the storage medium with respect to the specified set of storage medium characterization parameters values, in which case the testing for the specified set of storage medium characterization parameters is complete. In some implementations, testing is complete when the collected information satisfies a predetermined level of statistical accuracy. In some embodiments, testing completion further requires that the collected information be sufficient to generate first read comparison voltage values that satisfy a respective threshold error rate. In some embodiments, testing completion requires that the collected information be sufficient to generate transition probability values having a predetermined level of statistical accuracy.

If the test is not yet complete ("No" path from block 10-6), method 1000 includes repeating the portions of method 1000 represented by blocks 10-2 to 10-5 in order to generate more test data. On the other hand, if the testing is complete ("Yes" path from step 10-6), as represented by block 10-7, method 1000 includes generating transition probabilities for the characterization vector (i.e., the characterization vector corresponding to the specified set of one or more storage medium characterization parameter values). As represented by block 10-8, in some implementations, method 1000 includes converting the transition probabilities to LLR values. As represented by block 10-9, method 1000 includes generating distributions of the recorded read voltages (which are optionally generated while the reading voltages are recorded), and identifying respective voltages troughs from the distributions of recorded read voltages to use as first read comparison voltage values. For example, with further reference to FIG. 2, the read comparison voltages $V_{R1}$ 211, $V_{R2}$ 212, and $V_{R3}$ 213 are in voltage troughs positioned between adjacent center voltages, and define threshold voltages between the voltage ranges 201, 202, 203, 204. In some implementations, method 1000 bases the selection of a read comparison voltage on whether each such read comparison voltage is in the trough between two voltage distributions, in addition to or as an alternative to spacing the read comparison voltages at or near the halfway point between a respective pair of center voltages. In some implementations, method 1000 selects the read comparison voltages in accordance with predefined error minimization criteria (e.g., by selecting read comparison voltages that minimize read errors, in accordance with the recorded information). As noted above, in some implementations, method 1000 selects read comparison voltages that satisfy a respective (e.g., predefined) threshold error rate. The generated distributions of recorded read voltages are sometimes herein called statistics.

Figure 11:
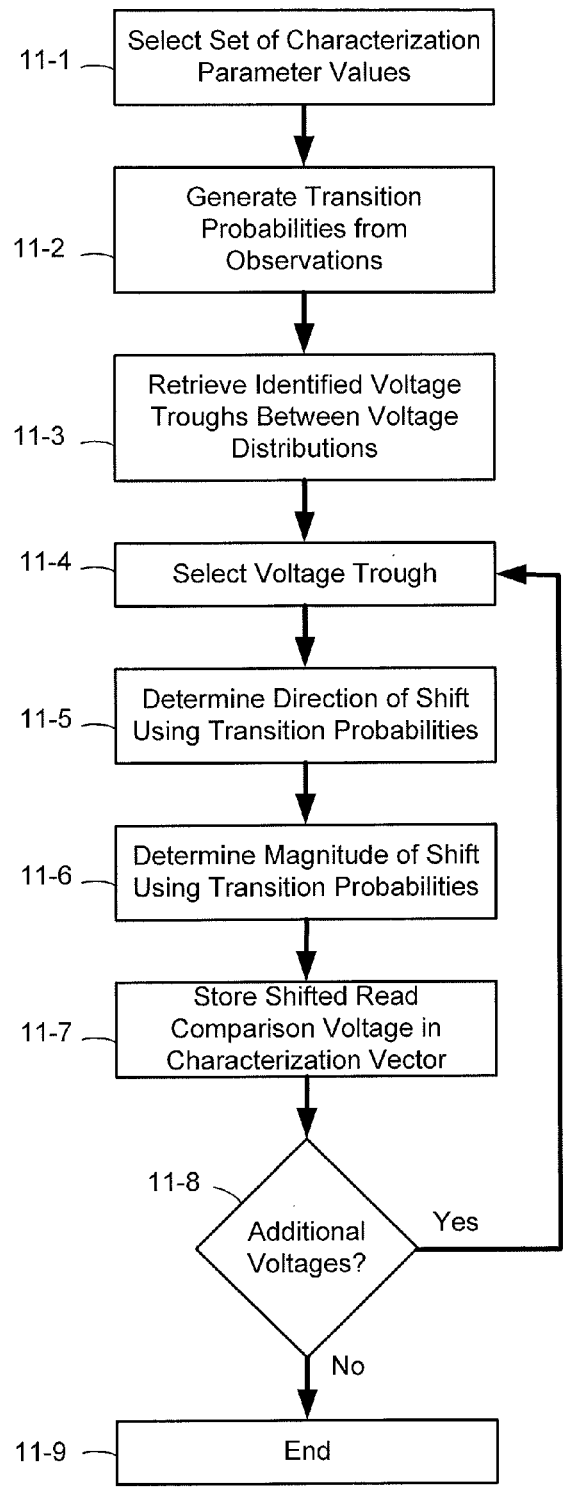
FIG. 11 is a flowchart representation of an implementation of a method of generating shifted read comparison voltages for reading from multi-level memory cells.

FIG. 11 is a flowchart representation of a method 1100 of generating shifted read comparison signal values (e.g., voltages) for reading data from multi-level memory cells, based on transition probabilities. In some implementations, method 1100 is performed by a module associated with a memory controller. Briefly, method 1100 includes statistically characterizing memory devices produced by a particular manufacturing process in order to determine a second set of read comparison signal values that may be used if a first set of read comparison signal values fails to provide data without at least one uncorrectable error.

To that end, as represented by block 11-1, method 1100 includes selecting a set of one or more storage medium characterization parameter values (sometimes herein called the specified set) defining testing conditions for a characterization vector. As represented by block 11-2, method 1100 includes generating transition probabilities for the specified set of one or more storage medium characterization parameter values. For example, the transition probabilities may be generated using the method described above with reference to FIG. 10. As represented by block 11-3, as described above, method 1100 includes retrieving or selecting the respective voltages troughs to use as first set of read comparison voltage values. Additionally and/or alternatively, the first set of read comparison voltage values may be nominal values based on equally spacing read comparison voltage values across the voltage range of a memory cell. As represented by block 11-4, method 1100 includes selecting one of the voltage troughs for which method 1100 will generate a corresponding shifted read comparison voltage value for the second set of read comparison voltage values to be stored in the characterization vector (i.e., the characterization vector corresponding to the specified set of one or more storage medium characterization parameter values).

As represented by block 11-5, method 1100 includes determining the offset direction of the respective shifted read comparison voltage in relation to the selected voltage trough, based on transition probabilities. In some implementations, determining the offset direction includes determining the sign of the difference between two transition probabilities representing adjacent voltage levels within a MLC flash memory cell. For example, with further reference to FIGS. 2 and 6A, as described above, one way to reduce the impact of a cell voltage drifting from one voltage range to an adjacent voltage range is to grey-code the bit-tuples. Grey-coding the bit-tuples includes constraining the assignment of bit-tuples such that a respective bit-tuple of a particular voltage range is different from a respective bit-tuple of an adjacent voltage range by only one bit. For example, as shown in FIG. 2, the corresponding bit-tuples for the adjacent ranges 201 and 202 are respectively "11" and "01", the corresponding bit-tuples for the adjacent ranges 202 and 203 are respectively "01" and "00", and the corresponding bit-tuples for the adjacent ranges 203 and 204 are respectively "00" and "10". As such, if the cell voltage drifts close to a closest read comparison voltage, the resulting error is limited to a single bit within the 2-bit bit-tuple. With respect to FIG. 6A, in some implementations grey-coding allows the transition probabilities to be used to generate a second or fallback (i.e., shifted) read comparison voltage value that may be used if the first read comparison voltage fails to produce a desired result. As noted above, grey-coding generally restricts the most-likely errors of multi-bit bit-tuples to single-bit errors. As such, pairs of transition probabilities associated with such errors are positioned adjacent along (i.e., adjacent, but not on) the diagonal of table 60 in FIG. 6A. For example, in some implementations, the transition probability pair $(p_{31}, p_{13})$ is used to generate the direction of a respective shifted read comparison voltage value offset from the read comparison voltage value $V_{R1}$. More specifically, in some implementations the direction of the offset from the read comparison voltage value $V_{R1}$ is provided by the sign of the difference of $(p_{31}-p_{13})$. Similarly, transition probability pairs $(p_{10}, p_{01})$ and $(p_{02}, p_{20})$ are be used to generate the respective directions of respective shifted read comparison voltage values offset from corresponding read comparison voltage values $V_{R2}$, $V_{R3}$, respectively.

As represented by block 11-6, method 1100 includes determining the magnitude of the offset of the shifted read comparison voltage, in relation to the selected read comparison voltage, based on the transition probabilities. In some implementations, the magnitude of the offset is based on the same two transition probabilities, $(p_{ij}, p_{ji})$, used to determine the direction of the aforementioned offset. In one example, the magnitude of the offset from the read comparison voltage value $V_{R1}$ is determined as a function of the transition probability pair $(p_{31}, p_{13})$.

In some implementations, the magnitude of the offset is determined as the absolute value of the difference between the probabilities of a transition probability pair (e.g., $(p_{31}, p_{13})$). In other words, the magnitude of the offset tracks the absolute value (e.g., $|p_{31}-p_{13}|$). For example, the magnitude of the offset is larger when the corresponding absolute value is larger. Similarly, magnitude of the offset is smaller when the corresponding absolute value is smaller.

In some implementations, the magnitude of the offset is determined as a linear or non-linear function of the absolute value of the difference between the probabilities of a transition probability pair, $(p_{ij}, p_{ji})$. In some implementations, the magnitude of the offset is a linear function of the difference between the respective transition probability pair, $(p_{ij}, p_{ji})$. For example, in some implementations, the magnitude of the offset is linearly determined as $\beta \times |p_{ij}-p_{ji}|$, where $\beta$ is a coefficient to convert the absolute value, $|p_{ij}-p_{ji}|$, to a voltage value. In some implementations $\beta$ is determined by flash characterization data. In some implementations, $\beta$ is determined by manufacturing process characterization data. In some implementations, the magnitude of the offset is a non-linear function of the difference between the respective transition probability pair, $(p_{ij}, p_{ji})$. For example, in some implementations, the magnitude of the offset is non-linearly determined as $\beta \times |p_{ij}-p_{ji}|^{\gamma}$, where the exponent $\gamma$ is used to include non-linear characterizations of a device and/or a system model. In some implementations, the non-linear characterizations, represented by $\gamma$, are determined from at least one of flash characterization data and manufacturing process characterization data. In some implementations, a curve fitting process is used in combination with one or more types of characterization data (e.g., flash characterization data, manufacturing process characterization data, etc.) to produce a higher-order non-linear model that can be used to determine the magnitude of the offset from a given probability pair $(p_{ij}, p_{ji})$. In some implementations, a respective mathematical model includes multiple terms, each having a respective scaling coefficient and/or exponent value. Accordingly, a curve fitting process is used to determine one or more coefficients and/or one or more exponent values of the non-linear model. In some implementations, the offset equations (or model) are determining using a machine learning methodology. For example, the equations are formulated using a combination of read out data and previously determined information, such as flash characterization data and/or data patterns based on historical data.

As represented by block 11-7, method 1100 includes storing the shifted read comparison voltage (or the offset between the shifted read comparison voltage and the corresponding read comparison voltage) in the characterization vector. As represented by block 11-8, method 1100 includes determining whether there are additional read comparison voltage levels to consider. If there are additional read comparison voltage levels to consider ("Yes" path from block 11-8), method 1100 includes repeating the portion of the method represented by blocks 11-4 to 11-7 so as determine an additional shifted read comparison voltage to be stored in the characterization vector for the specified set of one or more storage medium characterization parameter values. On the other hand, if there are no other read comparison voltage levels to consider ("No" path from block 11-8), method 1100 stops for the specified set of one or more storage medium characterization parameter values, as represented by block 11-9.

Figure 12:
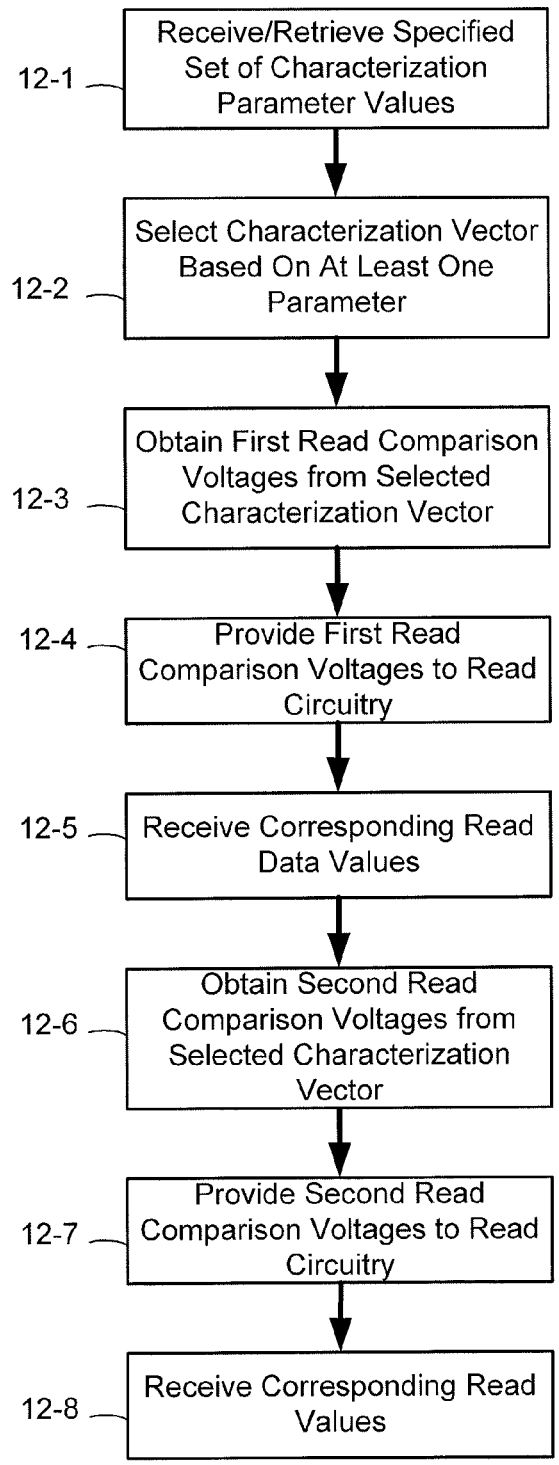
FIG. 12 is a flowchart representation of an implementation of a method of using multiple sets of read comparison voltages stored in a characterization vector.

FIG. 12 is a flowchart representation of an implementation of a method 1200 of reading data from a storage medium, using multiple sets of read comparison voltages stored in a characterization vector for the storage medium. In some implementations, method 1200 is performed by a memory controller or a module associated with a memory controller that is coupled to the storage medium, and is typically performed when a first read operation (see blocks 12-3, 12-4 and 12-5) fails to obtain data having no unrecoverable errors. Briefly, method 1200 includes retrieving at least two read comparison voltages from the characterization vector corresponding to a specified set of one or more storage medium characterization parameter values (e.g., corresponding to the current state of a storage medium), and applying the at least two read comparison voltages to read circuitry so as to retrieve raw data from the same set of memory locations of the storage medium at two different times.

To that end, as represented by block 12-1, method 1200 includes receiving or retrieving a specified set of one or more storage medium characterization parameter values corresponding to a current state of the storage medium from which data is to be read. As represented by block 12-2, method 1200 includes selecting a characterization vector based on the specified set of storage medium characterization parameter values. As represented by block 12-3, method 1200 includes obtaining the first read comparison voltage values from the selected characterization vector. As represented by block 12-4, method 1200 includes providing the first read comparison voltage values to read circuitry of the storage medium from which data is to be read. As represented by block 12-5, method 1200 includes receiving first read data values, from one or more specified addresses or memory locations of the storage medium, based on the first read comparison voltage values. As represented by block 12-6, method 1200 further includes obtaining the second read comparison voltage values from the selected characterization vector. As represented by block 12-7, method 1200 includes providing the second read comparison voltage values to read circuitry of the storage medium. As represented by block 12-8, method 1200 includes receiving second read data values from the same one or more specified addresses or memory locations of the storage medium as those accessed in block 12-5, based on the second read comparison voltage values. As described above, but not shown in FIG. 12, in some implementations data values for the one or more specified addresses or memory locations of the storage medium is recovered using at least the second read data values.

While various aspects of implementations within the scope of the appended claims are described above, it should be apparent that the various features of implementations described above may be embodied in a wide variety of forms and that any specific structure and/or function described above is merely illustrative. Based on the present disclosure one skilled in the art should appreciate that an aspect described herein may be implemented independently of any other aspects and that two or more of these aspects may be combined in various ways. For example, an apparatus may be implemented and/or a method may be practiced using any number of the aspects set forth herein. In addition, such an apparatus may be implemented and/or such a method may be practiced using other structure and/or functionality in addition to or other than one or more of the aspects set forth herein.

It will also be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

What is claimed is:

1. A device operable to provide one or more read comparison signal values for reading data from a storage medium, the device comprising:
    a characterization module including a plurality of characterization vectors; wherein each characterization vector corresponds to a set of one or more storage medium characterization parameter values and includes a first set of one or more read comparison signal values;
    a selection module to select a characterization vector based on a specified set of one or more storage medium characterization parameter values for the storage medium, the specified set comprising one or more of: a mode of operation associated with at least a portion of the storage medium, a history of use associated with at least a portion of the storage medium, a read type associated with at least a portion of the storage medium, and a location associated with at least a portion of the storage medium; and
    a read controller to provide the respective first set of one or more read comparison signal values, from the selected characterization vector, to read circuitry associated with the storage medium.

2. The device of claim 1, wherein the read controller is further to receive a read data request and prompt the selection module to select the characterization vector in response to receiving the read data request.

3. The device of claim 2, wherein the read controller is further to receive, in association with the read data request, the specified set of one or more storage medium characterization parameter values.

4. The device of claim 2, wherein the read controller is further to retrieve, in response to receiving the read data request, the specified set of one or more storage medium characterization parameter values.

5. The device of claim 1, wherein the set of one or more storage medium characterization parameter values further comprises an indication of a physical characteristic associated with at least a portion of the storage medium.

6. The device of claim 1, wherein, for each characterization vector, the respective first set of one or more read comparison signal values satisfies a respective threshold error rate associated with one or more statistics.

7. The device of claim 6, wherein:
    each characterization vector also includes a second set of one or more read comparison signal values;
    the read controller is to provide the respective first set of one or more read comparison signal values, from the selected characterization vector, to read circuitry associated with the storage medium at a first time; and the read controller is further to, at a second time, provide the respective second set of one or more read comparison signal values, from the selected characterization vector, to the read circuitry associated with the storage medium.

8. The device of claim 7, wherein the read controller is further to:

obtain an error indicator that indicates that the first set of one or more read comparison signal values yields data that includes at least one uncorrectable error; and provide the respective second set of one or more read comparison signal values to the read circuitry in response to obtaining the error indicator.

9. The device of claim 7, wherein, for each characterization vector, each of the respective second set of one or more read comparison signal values is associated with a corresponding one of the respective first set of one or more read comparison signal values and a respective transition probability pair corresponding to the set of one or more storage medium characterization parameter values.

10. The device of claim 9, wherein each of the respective second set of one or more read comparison signal values is offset from the corresponding one of the respective first set of one or more read comparison signal values in a direction determined by the sign of the difference between the respective transition probability pair.

11. The device of claim 9, wherein each of the respective second set of one or more read comparison signal values is offset from the corresponding one of the respective first set of one or more read comparison signal values by a magnitude based on the difference between the respective transition probability pair.

12. A method of providing one or more read comparison signal values for reading data from a storage medium, comprising:

selecting one of a plurality of characterization vectors based on a specified set of one or more storage medium characterization parameter values for the storage medium, the specified set comprising one or more of: a mode of operation associated with at least a portion of the storage medium, a history of use associated with at least a portion of the storage medium, a read type associated with at least a portion of the storage medium, and a location associated with at least a portion of the storage medium, wherein each of the plurality of characterization vectors corresponds to a set of one or more storage medium characterization parameter values and includes a first set of one or more read comparison signal values; and providing the respective first set of one or more read comparison signal values, from the selected characterization vector, to read circuitry associated with the storage medium.

13. The method of claim 12, further comprising receiving a read data request, and wherein selection of the characterization vector occurs in response to receiving the read data request.

14. The method of claim 13, further comprising receiving, in association with the read data request, the specified set of one or more storage medium characterization parameter values.

15. The method of claim 13, further comprising retrieving, in response to receiving the read data request, the specified set of one or more storage medium characterization parameter values.

16. The method of claim 12, wherein, for each characterization vector, the respective first set of one or more read comparison signal values satisfies a respective threshold error rate associated with one or more statistics.

17. The method of claim 16, wherein each characterization vector also includes a second set of one or more read comparison signal values, and the method includes:

at a first time, providing the respective first set of one or more read comparison signal values, from the selected characterization vector, to the read circuitry associated with the storage medium; and at a second time, providing the respective second set of one or more read comparison signal values, from the selected characterization vector, to the read circuitry associated with the storage medium.

18. The method of claim 17, further comprising:

obtaining an error indicator that indicates that the first set of one or more read comparison signal values yields data that includes at least one uncorrectable error, and wherein the second set of one or more read comparison signal values is provided to the read circuitry in response to obtaining the error indicator.

19. A method of generating read comparison signal values for reading data from a storage medium, the method comprising:

selecting a set of one or more storage medium characterization parameter values, the set comprising one or more of: a mode of operation associated with at least a portion of the storage medium, a history of use associated with at least a portion of the storage medium, a read type associated with at least a portion of the storage medium, and a location associated with at least a portion of the storage medium;

applying one or more testing conditions associated with the set of one or more storage medium characterization parameter values to at least one portion of the storage medium;

writing and reading a statistically significant amount of data to and from the at least one portion of the storage medium while applying the one or more testing conditions, and recording information comprising reading signal levels corresponding to the read data and information identifying reading errors;

generating statistics associated with the recorded information; and identifying read comparison signal levels based on the recorded reading signal levels.

20. The method claim 19, wherein the read comparison signal levels include voltage levels.

21. The method claim 19, wherein identifying read comparison signal levels includes identifying the read comparison signal levels in accordance with predefined error minimization criteria.

22. The method of claim 19, wherein the statistics include reading signal level distributions, and the method further comprising:

identifying one of more respective minimum values between adjacent reading signal level distributions;

generating a set of read comparison signal values based the one or more identified minimum values.

23. The method of claim 19, wherein the storage medium comprises flash memory.

24. The method of claim 23, wherein the flash memory is multi-level cell flash memory.

25. The method of claim 23, wherein the flash memory comprises at least one of NAND-type flash memory and NOR-type flash memory.

26. The method of claim 19, wherein the statistically significant amount of data is pseudo-randomly generated.

* * * * *

UNITED STATES PATENT AND TRADEMARK OFFICE
CERTIFICATE OF CORRECTION

PATENT NO.       : 8,938,658 B2
APPLICATION NO.  : 13/602031
DATED            : January 20, 2015
INVENTOR(S)      : Tai et al.

Page 1 of 1

It is certified that error appears in the above-identified patent and that said Letters Patent is hereby corrected as shown below:

In the claims,

Claim 20, col. 30, line 46, please delete "method claim" and insert --method of claim--;

Claim 21, col. 30, line 48, please delete "method claim" and insert --method of claim--;

Claim 22, col. 30, line 57, please delete "based the" and insert --based on the--.

Signed and Sealed this
Ninth Day of June, 2015

Michelle K. Lee
*Director of the United States Patent and Trademark Office*